US008338308B2

(12) United States Patent
Qiu et al.

(10) Patent No.: US 8,338,308 B2
(45) Date of Patent: Dec. 25, 2012

(54) METHOD OF PLASMA ETCHING GA-BASED COMPOUND SEMICONDUCTORS

(75) Inventors: Weibin Qiu, Urbana, IL (US); Lynford L. Goddard, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 367 days.

(21) Appl. No.: 12/638,741

(22) Filed: Dec. 15, 2009

(65) Prior Publication Data

US 2010/0159706 A1    Jun. 24, 2010

Related U.S. Application Data

(60) Provisional application No. 61/139,065, filed on Dec. 19, 2008.

(51) Int. Cl.
*H01L 21/302* (2006.01)
(52) U.S. Cl. ........ 438/710; 438/700; 438/703; 438/706; 216/37; 216/41; 216/67
(58) Field of Classification Search .................. 438/700, 438/703, 706, 710; 216/37, 41, 67
See application file for complete search history.

(56) References Cited

U.S. PATENT DOCUMENTS

| | | | | |
|---|---|---|---|---|
| 5,693,180 | A | * | 12/1997 | Furukawa et al. ............ 438/720 |
| 6,051,503 | A | * | 4/2000 | Bhardwaj et al. ............ 438/705 |
| 6,844,569 | B1 | * | 1/2005 | Lee et al. ..................... 257/79 |
| 7,579,202 | B2 | * | 8/2009 | Hsu et al. ..................... 438/33 |
| 2005/0236365 | A1 | * | 10/2005 | Komatani ..................... 216/67 |

OTHER PUBLICATIONS

Lee Ji-Myon et al. Journal of the Electrochemical Society, vol. 147(5), (2000), pp. 1859-1863.*
S. Wolf et al. Silicon Processing for the VLSI Era, Lattice Press (1986) pp. 546 and pp. 574-578.*
Akimoto, T.; Nanbu, H.; Ikawa, E. "Reactive Ion Etching Lag on High Rate Oxide Etching Using High Density Plasma," *J. Vac. Sci. Technol. B*, 1995, 13, pp. 2390-2393.
Berg, E.W.; Pang, S.W. "$Cl_2$ Plasma Passivation of Etch Induced Damage in GaAs and InGaAs with an Inductively Coupled Plasma Source," *J. Vac. Sci. Technol. B*, 1999, 17(6), pp. 2745-2749.

(Continued)

*Primary Examiner* — Lan Vinh
*Assistant Examiner* — Maki Angadi
(74) *Attorney, Agent, or Firm* — Drinks Hofer Gilson & Lione

(57) ABSTRACT

A method of plasma etching Ga-based compound semiconductors includes providing a process chamber and a source electrode adjacent to the process chamber. The process chamber contains a sample comprising a Ga-based compound semiconductor. The sample is in contact with a platen which is electrically connected to a first power supply, and the source electrode is electrically connected to a second power supply. The method includes flowing $SiCl_4$ gas into the chamber, flowing Ar gas into the chamber, and flowing $H_2$ gas into the chamber. RF power is supplied independently to the source electrode and the platen. A plasma is generated based on the gases in the process chamber, and regions of a surface of the sample adjacent to one or more masked portions of the surface are etched to create a substantially smooth etched surface including features having substantially vertical walls beneath the masked portions.

20 Claims, 21 Drawing Sheets

OTHER PUBLICATIONS

Bouchoule, S.; Patriarche, G.; Guilet, S.; Gatilova, L.; Gatilova, L.; Largeau, L. "Sidewall Passivation Assisted by a Silicon Coverplate During Cl$_2$-H$_2$ and HBr Inductively Coupled Plasma Etching of InP for Photonic Devices," *J. Vac. Sci. Technol. B*, 2008, 26(2), pp. 666-674.

Choquette, K.D.; Shul, R.J.; Howard, A.J.; Rieger, D.J. "Smooth Reactive Ion Etching of GaAs Using a Hydrogen Plasma Pretreatment," *J. Vac. Sci. Technol. B*, 1995, 13(1), pp. 40-42.

Chung, C-K. "Geometrical Pattern Effect on Silicon Deep Etching by an Inductively Coupled Plasma System," *J. Micromech. Microeng.*, 2004, 14, pp. 656-662.

Dultsev, F.N.; Nenasheva, L.A. "The Effect of Hydrogen as an Additive in Reactive Ion Etching of GaAs for Obtaining Polished Surface," *Applied Surface Science*, 2006, 253, pp. 1287-1290.

Edwards, G.T.; Sobiesierski, A.; Westwood, D.I.; Smowton, P.M. "Fabrication of High-Aspect-Ratio, Sub-Micron Gratings in AlGaInP / GaAs Laser Structures Using a BCl$_3$/Cl$_2$/Ar Inductively Coupled Plasma," *Semicond. Sci. Technol.*, 2007, 22, pp. 1010-1015.

Etrillard, J.; Ossart, P.; Patriarche, G.; Juhel, M.; Bresse, J.F.; Daguet, C. "Anisotropic Etching of InP with Low Sidewall and Surface Induced Damage in Inductively Coupled Plasma Etching Using SiCl$_4$," *J. Vac. Sci. Technol. A*, 1997, 15, pp. 626-632.

Golka, S.; Austerer, M.; Pflügl, C.; Schrenk, W.; Strasser, G. "Processing of Deeply Etched GaAs/AlGaAs Quantum Cascade Lasers with Grating Structures," *Mater. Res. Soc. Symp. Proc.*, 2005, 829, pp. B5.2.1-B5.2.5.

Jalabert, L...; Dubreuil, P.; Carcenac, F.; Pinaud, S.; Salvagnac, L.; Granier, H.; Fontaine, C. "High Aspect Ratio GaAs Nanowires Made by ICP-RIE Etching using Cl$_2$/N$_2$ Chemistry," *Microelectronic Engineering*, 2008, 85, pp. 1173-1178.

Jung, M.; Lee, S.; Jhon, Y. M.; Mho, S-i.; Cho, J-w.; Woo, D. "Nanohole Arrays with Sub-30 nm Diameter Formed on GaAs Using Nanoporous Alumina Mask," *Jpn. J. Appl. Phys.*, 2007, 46, pp. 4410-4412.

Lee, H.W.; Kim, M.; Min, N-K.; Efremov, A.; Lee, C-W; Kwon, K-H. "Etching Characteristics and Mechanism of InP in Inductively Coupled HBr/Ar Plasma," *Jpn. J. Appl. Phys.*, 2008, 47, pp. 6917-6922.

Lee, J.W.; Devre, M.W.; Reelfs, B.H.; Johnson, D.; Sasserath, J.N.; Clayton, F.; Hays, D.; Pearton, S.J. "Advanced Selective Dry Etching of GaAs/AlGaAs in High Density Inductively Coupled Plasmas," *J. Vac. Sci. Technol. A*, 2000, 18(4), pp. 1220-1224.

Lee, J.W.; Jung, P.G.; Devre, M.; Westermann, R.; Pearton, S.J. Optimization of Gas Flow and Etch Depth Uniformity for Plasma Etching of Large Area GaAs Wafers, *Solid-State Electronics*, 2002, 46, p. 685-688.

Lee, K.H.; Guilet, S.; Sagnes, I.; Talneau, A. "N$_2$-Based ICP-RIE Etching for InP-Based Photonic Crystal Membranes." *Conference Proceedings 19$^{th}$ IPRM*, Matsue, Japan, 2007, pp. 222-225.

Li, X.; Cao, X.; Zhou, H.; Wilkinson, C.D.W.; Thoms, S.; Macintyre, D.; Holland, M.; Thayne, I.G. "A Low Damage RIE Process for the Fabrication of Compound Semiconductor Based Transistors with Sub-100 nm Tungsten Gates," *Microelectronic Engineering*, 2006, 83, pp. 1159-1162.

Lim, W.T.; Baek, I.G.; Jung, P.G.; Lee, J.W.; Cho, G.S.; Lee, J.I.; Cho, K.S.; Pearton, S.J. "Investigation of GaAs Dry Etching in a Planar Inductively Coupled BCl$_3$ Plasma," *J. of the Electrochemical Society*, 2004, 151(3), pp. G163-G166.

Lin, J.; Leven, A.; Weimann, N.G.; Yang, Y.; Kopf, R.F.; Reyes, R.; Chen, F-S. "Smooth and Vertical—Sidewall InP Etching Using Cl$_2$/N$_2$ Inductively Coupled Plasma," *J. Vac. Sci. Technol. B*, 2004, 22(2), pp. 510-512.

Lu, J.; Meng, X; SpringThorpe, A.J.; Shepherd, F.R.; Poirier, M. "Inductively Coupled Plasma Etching of GaAs Low Loss Waveguides for a Traveling Waveguide Polarization Converter, Using Chlorine Chemistry," *J. Vac. Sci. Technol. A*, 2004, 22(3), pp. 1058-1061.

Maher, H.; Etrillard, J.; Decobert, J.; Nissim, Y.I. "Dry Etch Recess of an InGaAs/InAlAs/InP HEMT Like Structure Using a Low Energy High Density SiCl$_4$ Plasma (ICP)," *10$^{th}$ Intern. Conference on Indium Phosphide and Related Materials*, Tsukuba, Japan, 1998, p. 793-796.

Nam, P.S.; Ferreira, L.M.; Lee, T.Y.; Tu, K.N. "Study of Grass Formation in GaAs Backside via Etching Using Inductively Coupled Plasma System," *J. Vac. Sci. Technol. B*, 2000, 18(6), p. 2780-2784.

Rommel, S.L.; Jang, J-H.; Lu, W.; Cueva, G.; Zhou, L.; Adesida, I.; Pajer, G.; Whaley, R.; Lepore, A.; Schellanbarger, Z.; Abeles, J.H. "Effect of H$_2$ on the Etch Profile of InP/InGaAsP Alloys in Cl$_2$/Ar/H$_2$ Inductively Coupled Plasma Reactive Ion Etching Chemistries for Photonic Device Fabrication," *J. Vac. Sci. Technol. B*, 2002, 20(4), pp. 1327-1330.

Schartner, S.; Golka, S.; Pflügl, C.; Schrenk, W.; Strasser, G. "Deeply Etched Waveguide Structures for Quantum Cascade Lasers," *Microelectronic Engineering*, 2006, 83, p. pp. 1163-1166.

Shul, R.J.; McClellan, G.B.; Briggs, R.D.; Rieger, D.J.; Pearton, S.J.; Abernathy, C.R.; Lee, J.W.; Constantine, C.; Barratt, C. "High-Density Plasma Etching of Compound Semiconductors," *J. Vac. Sci. Technol. A*, 1997, 15(3), pp. 633-637.

Yoon, S.F.; Ng, T.K.; Zheng, H.Q. "Study of GaAs and GaInP Etching in Cl$_2$/Ar Electron Cyclotron Resonance Plasma," *Thin Solid Films*, 2001, 394, pp. 250-255.

\* cited by examiner

Ar flow rate = 2 sccm　　　　　Ar = 2.5 sccm

Ar = 3 sccm　　　　　Ar = 4 sccm

Ar = 5 sccm

Chamber pressure = 5 mTorr, $H_2$ = 1 sccm

Ar=1sccm      Ar=2sccm

Chamber pressure = 8 mTorr, $H_2$ = 1 sccm

Ar=3sccm      Ar=4sccm      Ar= 5sccm

Ar = 1 sccm　　　　　Ar = 2 sccm　　　　　Ar = 4 sccm

Chamber pressure = 8 mTorr, $H_2$=2 sccm

Ar = 5 sccm　　　　　Ar = 6 sccm　　　　　Ar = 8 sccm

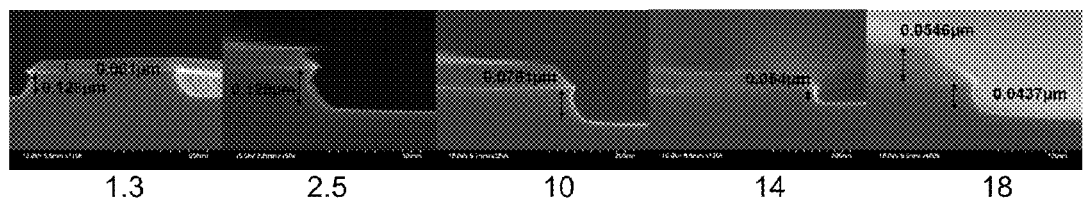
| 1.3 | 2.5 | 10 | 14 | 18 |
| --- | --- | --- | --- | --- |
| Fig. 18A | Fig. 18B | Fig. 18C | Fig. 18D | Fig. 18E |
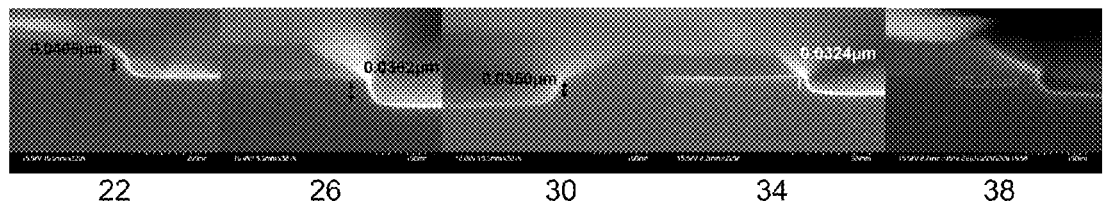
| 22 | 26 | 30 | 34 | 38 |
| --- | --- | --- | --- | --- |
| Fig. 18F | Fig. 18G | Fig. 18H | Fig. 18I | Fig. 18J |
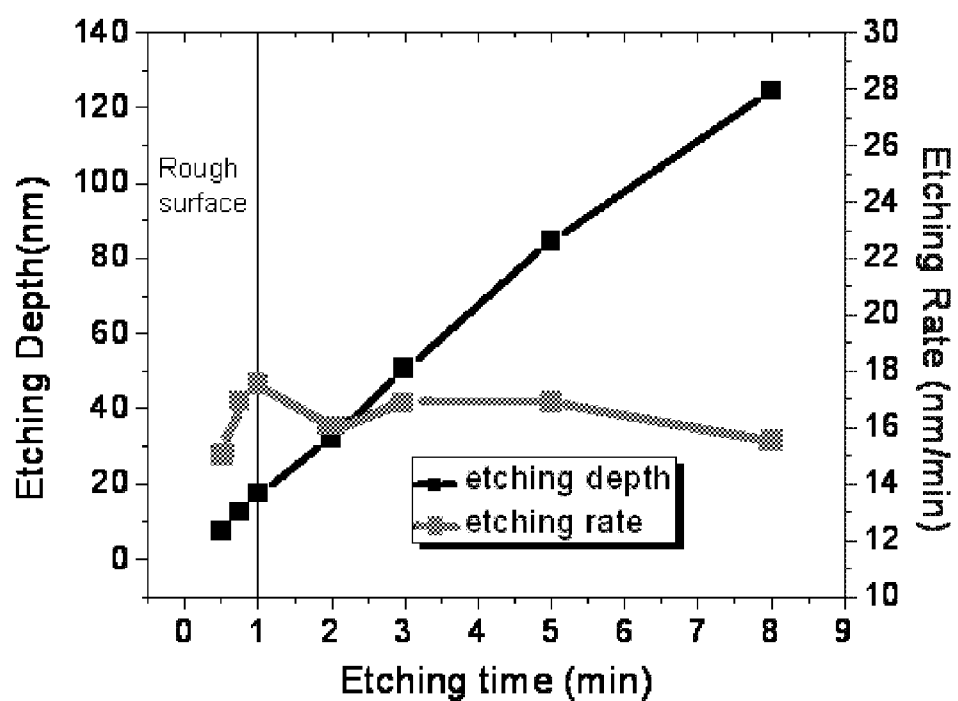
Figure 19

15 seconds  30 seconds 45 seconds  1 minute 2 minutes  3 minutes

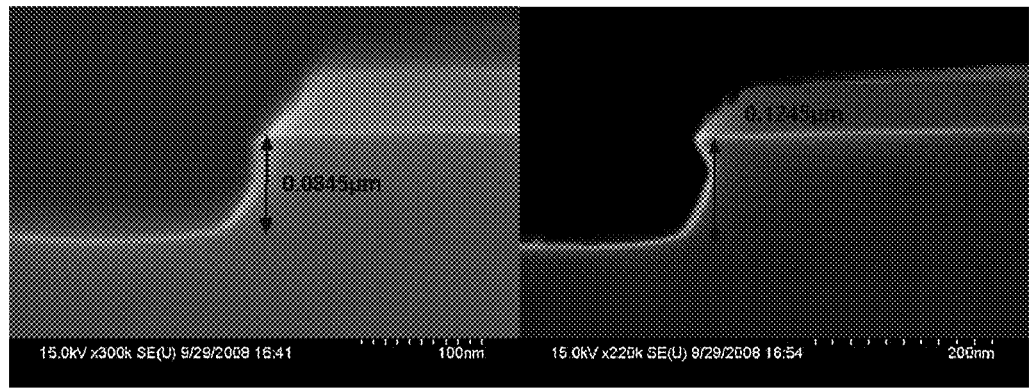
5 minutes
8 minutes
Fig. 20G
Fig. 20H
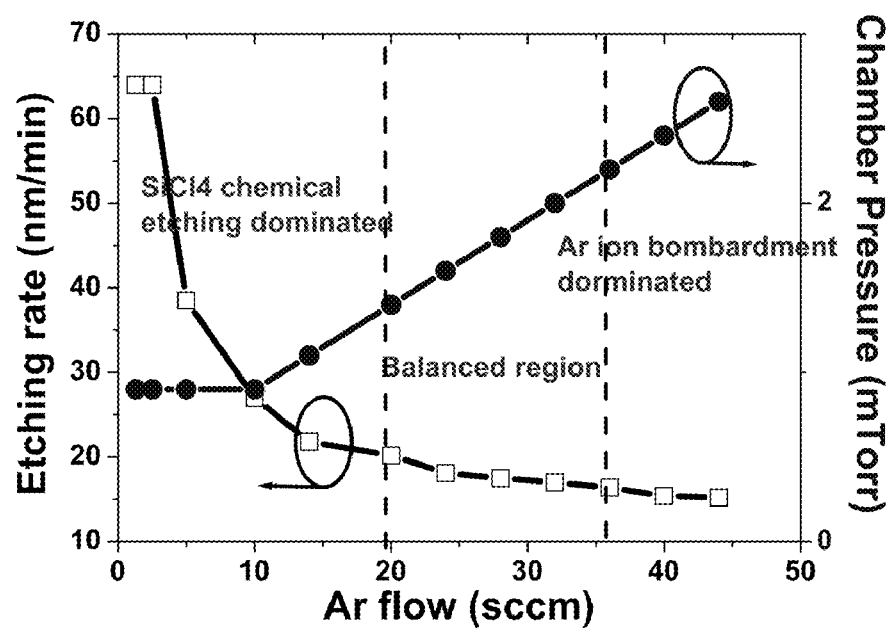
Figure 21

METHOD OF PLASMA ETCHING GA-BASED COMPOUND SEMICONDUCTORS

RELATED APPLICATION

The present patent document claims the benefit of the filing date under 35 U.S.C. §119(e) of Provisional U.S. Patent Application Ser. No. 61/139,065, filed Dec. 19, 2008, which is hereby incorporated by reference in its entirety.

FEDERALLY SPONSORED RESEARCH OR DEVELOPMENT

This invention was made with Government support under Contract Number DE-AC52-07NA27344 awarded by the Department of Energy. The Government has certain rights in this invention.

TECHNICAL FIELD

The present disclosure is directed generally to semiconductor processing and more specifically to etching methods for Ga-based compound semiconductors.

BACKGROUND

Wet and dry etching methods are widely used to define patterns in semiconductors. Wet etching techniques rely on chemical solutions to carve out features, while dry etching methods utilize the chemical and physical action of ions for material removal. Although wet etching offers the benefits of simplicity and low cost, wet etching methods are inadequate for defining very small features and tend to remove material isotropically, instead of directionally. In contrast, dry etching offers the benefits of anisotropy and tight control over etching rate and feature dimensions. With the increasing complexity and integration of semiconductor electronic and optical devices, dry etching has become a critical process in the dimensional control of vertically etched structures (e.g., mesas).

GaAs and other III-V compound semiconductors are a key component of various photonic and electronic devices, such as lasers, modulators, detectors, amplifiers, passive waveguide devices, heterojunction bipolar transistors (HBTs), and high electron mobility transistors (HEMTs). The fabrication of smooth and vertical mesas in lasers, passive waveguides, and other optical devices based on III-V compound semiconductors is important for reducing scattering and minimizing waveguide propagation losses. In addition, surface roughness can increase non-radiative recombination center levels, which in turn can degrade the internal quantum efficiency of such devices. In electronic devices, surface roughness can introduce additional defect levels into the bandgaps of semiconductors that can diminish electronic performance.

Plasma etching is a widely used dry etching method for GaAs and other III-V compound semiconductors. Among the various plasma etching techniques, reactive ion etching (RIE) and inductively coupled plasma (ICP) are the most common for etching III-V compound semiconductors. ICP provides several advantages over RIE. Because there are two power inputs in the ICP system, the plasma density and the plasma energy may be controlled independently and damage due to ion bombardment can be reduced accordingly. In addition, the chamber pressure in an ICP system is reduced by about an order of magnitude compared to that in an RIE system. ICP etching rates in excess of one micron per minute (1 µm/min) have been achieved for GaAs, but the etched structures often show sidewall damage or off-vertical profiles.

BRIEF SUMMARY

Low-rate and high-rate processes for plasma etching Ga-based compound semiconductors that provide advantages over existing etching methods are described herein. The etching processes permit desired etch rates to be attained while allowing the smoothness of the etched surface and the verticality of the etched profiles to be improved.

According to one embodiment, a method of plasma etching Ga-based compound semiconductors includes providing a process chamber and a source electrode adjacent to the process chamber. The process chamber contains a sample comprising a Ga-based compound semiconductor. The sample is in contact with a platen which is electrically connected to a first power supply, and the source electrode is electrically connected to a second power supply. The method includes flowing $SiCl_4$ gas into the chamber, flowing Ar gas into the chamber, and flowing $H_2$ gas into the chamber. RF power is supplied to the source electrode using the second power supply, and RF power is supplied to the platen using the first power supply. A plasma is generated based on the gases in the process chamber, and regions of a surface of the sample adjacent to one or more masked portions of the surface are etched to create a substantially smooth etched surface including features having substantially vertical walls beneath the masked portions.

According to a second embodiment, a method of plasma etching Ga-based compound semiconductors includes providing a process chamber and a source electrode adjacent to the process chamber. The process chamber contains a sample comprising a Ga-based compound semiconductor. The sample is in contact with a platen which is electrically connected to a first power supply, and the source electrode is electrically connected to a second power supply. The method includes flowing $SiCl_4$ gas into the chamber and flowing Ar gas into the chamber. RF power is supplied to the platen at a first power level using the first power supply, and RF power is supplied to the source electrode using the second power supply. A plasma is generated based on the gases in the process chamber. After generating the plasma, RF power is supplied to the platen at a second power level lower than the first power level and no greater than about 30 W, and regions of a surface of the sample adjacent to one or more masked portions of the surface are etched at an etching rate of no more than about 25 nm/min to create a substantially smooth etched surface.

According to a third embodiment, a method of plasma etching Ga-based compound semiconductors includes providing a process chamber and a source electrode adjacent to the process chamber. The process chamber contains a sample comprising a Ga-based compound semiconductor. The sample is in contact with a platen which is electrically connected to a first power supply, and the source electrode is electrically connected to a second power supply. The method includes flowing $SiCl_4$ gas into the chamber and flowing Ar gas into the chamber. $H_2$ gas is also flowed into the chamber. RF power is supplied to the platen at a first power level using the first power supply, and RF power is supplied to the source electrode using the second power supply. A plasma is generated based on the gases in the process chamber. After generating the plasma, RF power is supplied to the platen at a second power level lower than the first power level and no greater than about 30 W, and regions of a surface of the sample adjacent to one or more masked portions of the surface are etched at an etching rate of no more than about 2 nm/min to create a substantially smooth etched surface.

BRIEF DESCRIPTION OF THE DRAWINGS

FIGS. 18A-18J are SEM images of GaAs etched profiles obtained at various Ar flow rates (in sccm) after two minutes of etching;

FIG. 19 shows etching depth and etching rate as a function of etching time;

FIGS. 20A-20H are SEM images of GaAs etched profiles obtained over various etch times using an $SiO_2$ etching mask;

FIG. 21 shows the etching rate of GaAs and the real chamber pressure as functions of Ar flow rate;

DETAILED DESCRIPTION

Figure 1:
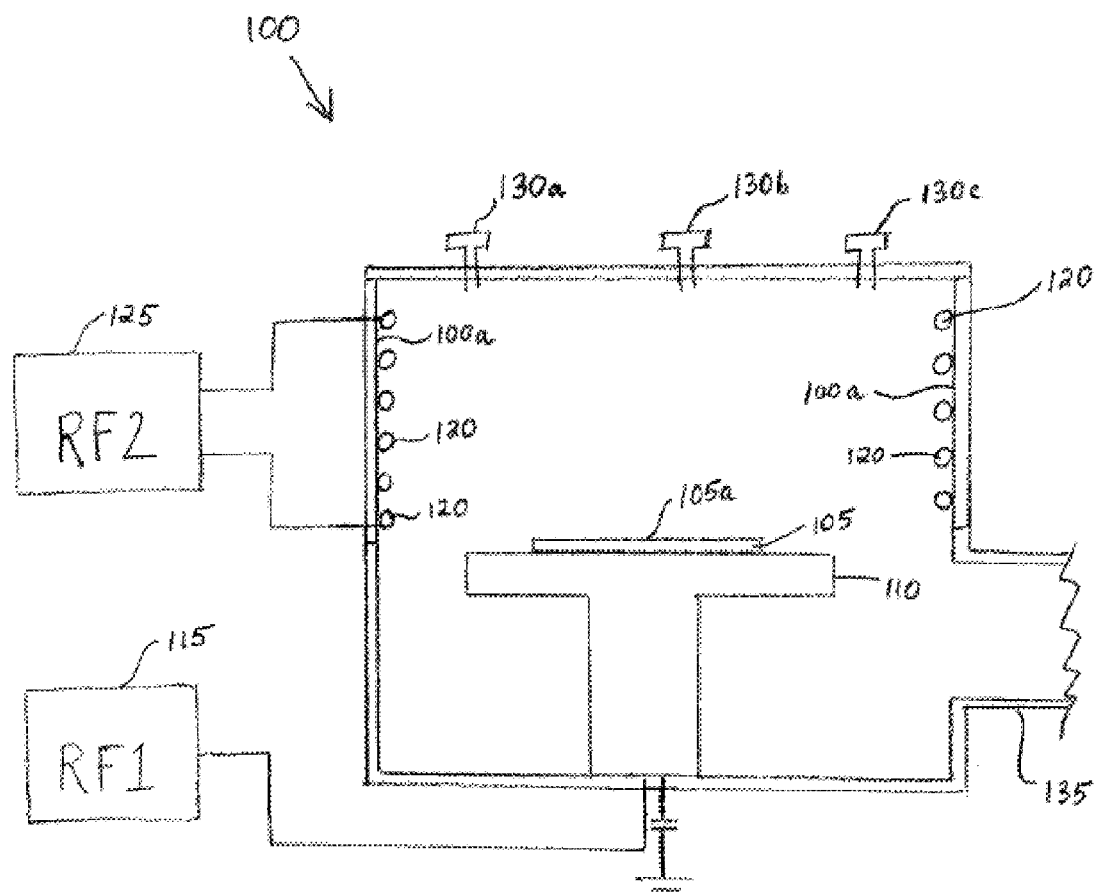
FIG. 1 is a schematic (cross-sectional side view) of an exemplary inductively coupled plasma (ICP) process chamber.

FIG. 1 shows a schematic of an exemplary process chamber 100 suitable for carrying out the etching methods of the present disclosure. The chamber 100 contains a sample 105, such as a compound semiconductor wafer, having a surface 105a to be etched. The sample 105 is in contact with a conductive platen 110, which is electrically connected to a first radiofrequency (RF) power supply 115. The process chamber 100 includes a source electrode 120, which is shown here as a set of coils 120 adjacent to the wall 100a of the chamber 100. The source electrode 120 is electrically connected to a second radiofrequency (RF) power supply 125, which supplies RF power to the coils to generate a plasma in the chamber 100. Process gases present in the chamber 100 are ionized to form the plasma. The power ("RF2") applied to the source electrode 120 primarily affects the plasma density or ion flux, and the power ("RF1") applied to the platen 110 by the first RF power supply 115 primarily affects the energy of the ions. The platen 110 may be a chuck, holder, or other mechanism configured to support or otherwise contact the sample 105 to be etched. Such a configuration, where the power to the source electrode 120 is controlled independently from the power to the platen 110, is known as an inductively coupled plasma (ICP) system. The action of the plasma on exposed portions of the sample 105 leads to physical and chemical etching of the surface 105a. The process chamber 100 may be, for example, a commercially-available PlasmaTherm SLR 770 ICP-RIE system.

The process chamber 100 includes one or more gas inlets for introducing the process gases into the chamber. The process gases may be introduced into the chamber via separate gas inlets, or they may first be mixed in a manifold immediately outside the chamber and then introduced via a single entry point directly above the sample. Preferably, mass flow controllers are employed to measure and control the flow of the process gases into the chamber (or into the manifold). The process chamber 100 also includes a port 135 for attachment to a high-throughput pumping system. A feedback-controlled throttle valve between the process chamber 100 and the pumping system maintains the desired gas pressure in the chamber 100.

In order to create three-dimensional features on the surface of the sample during the etching process, the sample is patterned prior to etching. The patterning process combines lithography, deposition and lift-off steps known in the art to form a mask overlying one or more portions ("masked portions") of the surface of the sample. The mask remains on the sample during the etching process, and includes one or more layers of a material that is substantially resistant to the etching action of the plasma. The one or more masked portions of the surface are substantially excluded from the directional etching process, while the regions of the surface adjacent to the masked portions are exposed to the plasma and etched. In this way, three-dimensional features, such as mesas, may be carved into the surface of the sample consistent with the two-dimensional pattern of the mask.

By properly tailoring the etch chemistry, including the types of process gases employed and their flow rates into the chamber, and by controlling other process parameters, the inventors have found that it is possible to significantly improve the quality of the etched surface of Ga-based compound semiconductors at both high and low etching rates. High etching rates are desirable for bulk etching, and low etching rates are advantageous for fine features where control over dimensions and surface roughness is paramount. In both cases, it is advantageous to optimize the smoothness of the etched surface and the verticality of the etched profiles. The high rate and low rate etching methods described herein may be applied to any Ga-based compound semiconductor, including, but not limited to, GaAs, AlGaAs, InGaAs, GaAsP, InGaP, InGaN, AlGaN, GaInAs, and AlGaInAs, and may be more broadly applicable to other semiconductors as well.

High Rate Etching Process

Figure 2:
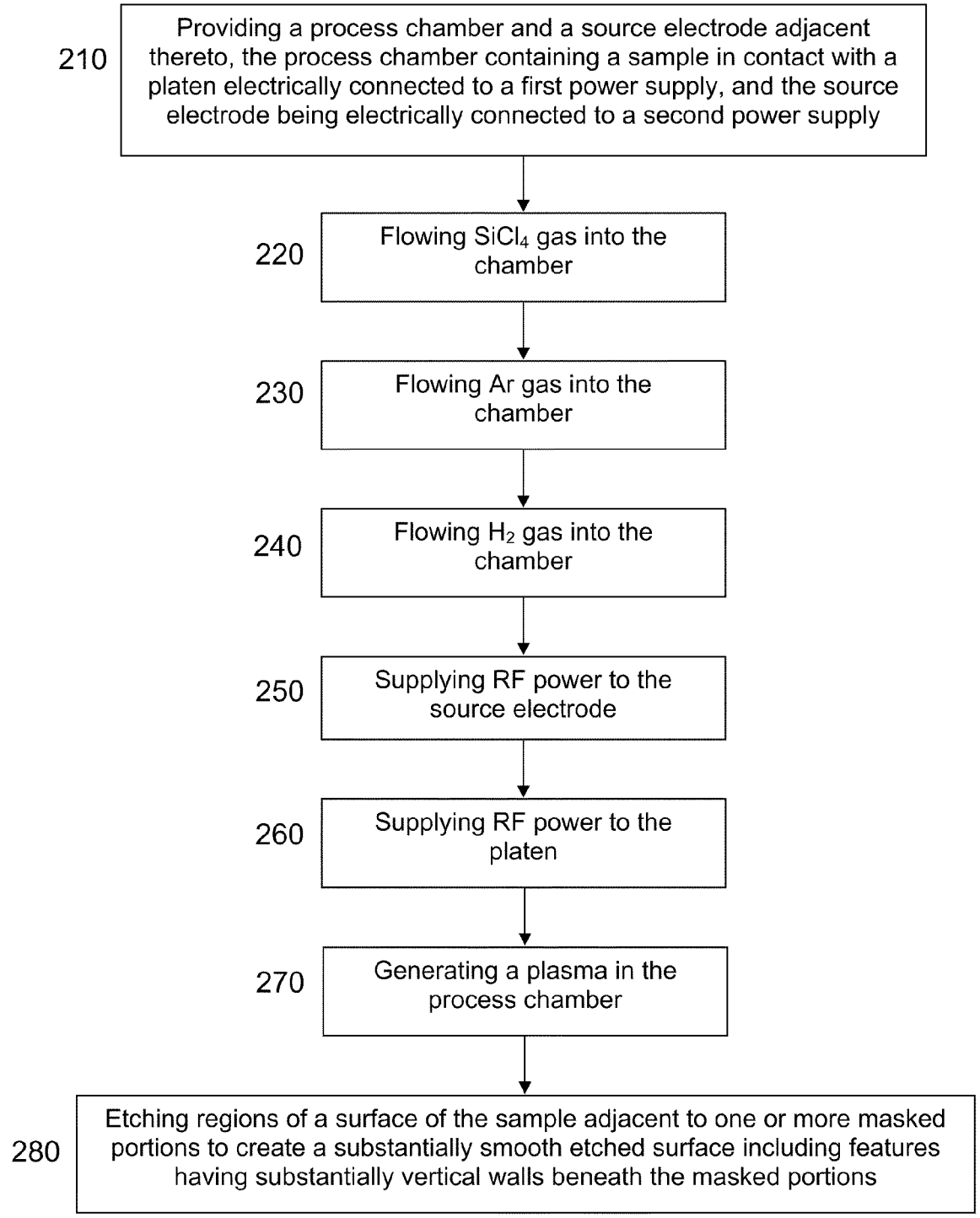
FIG. 2 is a flow chart showing steps in one embodiment of a method of plasma etching Ga-based compound semiconductors.

The high rate etching method may be employed to plasma etch surfaces of Ga-based compound semiconductors for applications in optics and electronics. Referring to the flow chart of FIG. 2, the method includes providing 210 a process chamber containing a sample comprising a Ga-based compound semiconductor. The sample is in contact with a platen which is electrically connected to a first power supply. A source electrode (e.g., the set of coils 120 shown in FIG. 1) which is electrically connected to a second power supply is adjacent to the process chamber. The method also includes flowing $SiCl_4$ gas into the chamber 220, flowing Ar gas into the chamber 230, and flowing $H_2$ gas into the chamber 240. RF power is supplied 250 to the source electrode using the second power supply, and RF power is supplied 260 to the platen using the first power supply. A plasma is generated 270 based on the gases in the chamber. Regions of a surface of the sample adjacent to one or more masked portions of the surface are etched 270 to create a substantially smooth etched surface including features having substantially vertical walls under the masked portions.

The inventors have recognized that including $H_2$ gas in a gas mixture of $SiCl_4$ and Ar gas leads to improved smoothness in the etched surface at high etch rates, an effect that may be attributable to a passivating effect of silicon nanocrystals formed during etching. The flow of Ar gas and use of a Ni/Cr mask have been found to be beneficial for controlling the verticality of the etched features. The rms roughness of the substantially smooth etched surface of the compound semiconductor may be about 0.16 nm or less or, preferably, about 0.12 nm or less. The substantially vertical walls of the features etched into the surface may measure about 90°+/−2° or, preferably, 90°+/−1° with respect to the etched surface.

The etching is carried out at an etch rate of at least about 300 nm/min, preferably at least about 450 nm/min, and even more preferably at least about 500 nm/min. Typically, the etching is conducted for a time duration ranging from about two to about four minutes, although other time durations are possible depending on the desired depth of the features. The features (e.g., mesas) are typically at least about 1-2 microns in depth (height), and may be at least about 4 microns in depth.

The surface profile and smoothness of the etched samples and the etching rate of the plasma may depend on the flow rates of the process gases, the chamber pressure, and the RF power applied independently to the platen (RF1 power) and to the source electrode (RF2 power). These process parameters are discussed in detail below in reference to a series of etching experiments conducted by the inventors on GaAs samples.

Prior to etching, the GaAs samples were patterned into 3 μm, 5 μm, 10 μm, 20 μm, and 30 μm wide stripes with conventional photolithography techniques. Next, consecutive layers of titanium, chromium, and nickel (Ti/Cr/Ni) were deposited using vapor deposition techniques known in the art, and the samples were dipped into acetone for a lift-off process to form a mask overlying portions of the GaAs surface. Then the wafers were cleaved into small pieces in order to compare various etching treatments.

The inventors employed a PlasmaTherm SLR 770 ICP-RIE system to conduct the etching experiments. Samples were transferred into the etching chamber with a load lock. An RF bias (13.56 MHz) and an inductive power (2 MHz) in the range of 0-1000 W were applied to the platen and source electrode (coils). The chamber pressure was controlled by a feedback-controlled throttle valve. Process gases were introduced into the chamber with a series of mass flow controllers calibrated to flow rates as low as 0.1 standard cubic centimeter per minute (sccm).

The etched mesas and plasma etching rates were characterized using a Hitachi S4800 scanning electron microscope (SEM) to provide a cross-sectional view of the cleaved strips. The surface roughness was measured with a Digital Instruments Dimension 3000 atomic force microscope (AFM).

Figure 3:
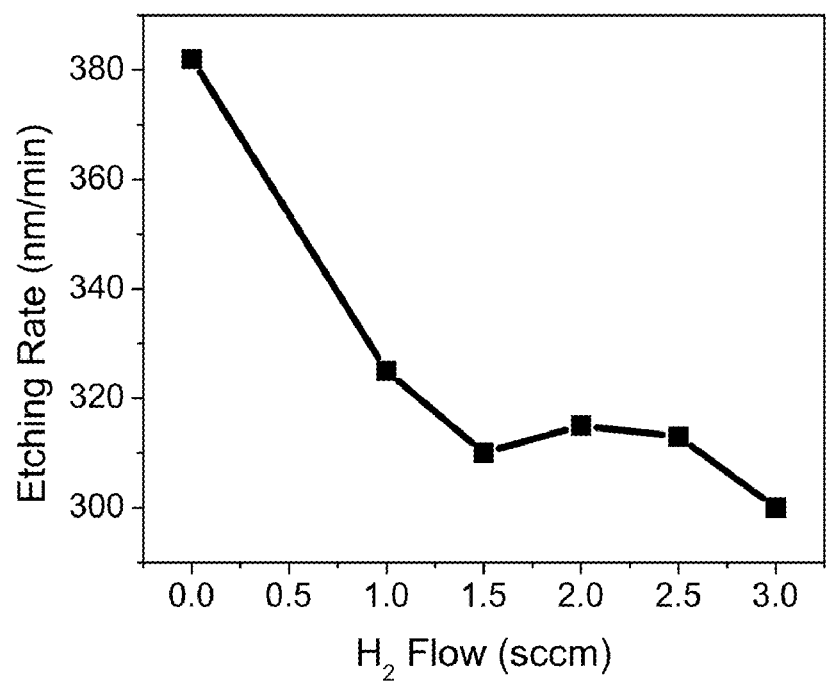
FIG. 3 is a chart showing the etching rate as a function of $H_2$ flow.

The inventors evaluated the impact of $H_2$ on the etching process. FIG. 3 shows the plasma etching rate as a function of $H_2$ flow while keeping other parameters fixed: $SiCl_4$ flow at 2 sccm, Ar flow at 3 sccm, chamber pressure at 1 mTorr, RF1 at 120 W, and RF2 at 500 W. The RF1 power and RF2 power affect the plasma energy and density, respectively. The $H_2$ flow is varied from 0 sccm to 3 sccm.

Figures 4A, 4B:
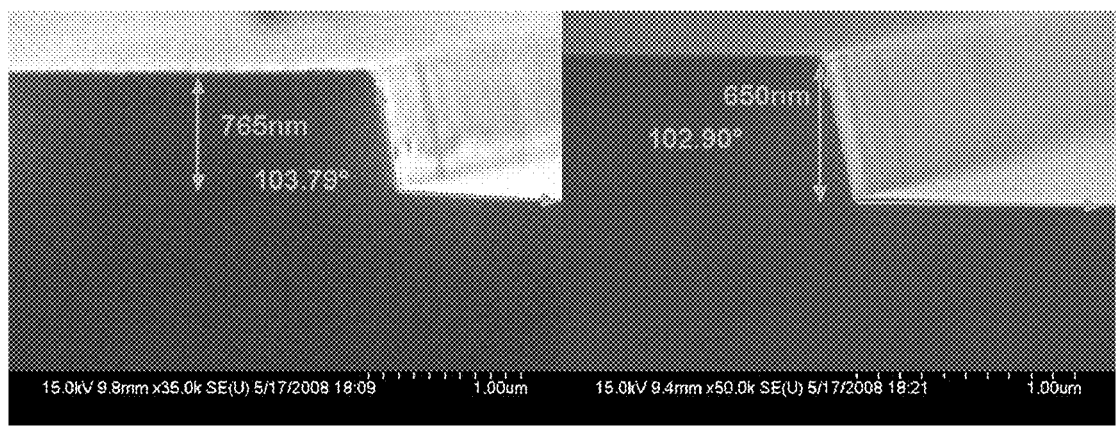
FIGS. 4A and 4B are scanning electron microscope (SEM) images of a GaAs mesa etched (FIG. 4A) without $H_2$ in the process chamber and (FIG. 4B) with a 1 sccm flow rate of $H_2$ in the process chamber.

Referring to FIG. 3, without $H_2$ in the chamber, i.e. when the flow is 0 sccm, the etching rate of the GaAs sample is 380 nm/min. However, the surface is rough and the etching profile is trapezoidal, as shown in FIG. 4A. Adjusting the Ar flow slightly modifies the mesa profile, but the sidewall and surface roughnesses do not improve. At 1 sccm of $H_2$ flow, the sidewall and etched surface become smoother, as shown in FIG. 4B. The inventors attribute the smoothening effect to a reaction between $SiCl_4$ and $H_2$:

$$SiCl_4 + 2H_2 \rightarrow Si + 4HCl \qquad (1)$$

The reaction yields Si nanocrystals that have a passivating effect on the surface during etching, which leads to increased smoothness. Also, the reaction reduces the etching rate, since the hydrogen consumes some of the $SiCl_4$ etching gas. Since the amount consumed depends on $H_2$ concentration, the etching rate decreases with additional $H_2$, as shown in FIG. 3. Generally speaking, the $H_2$ gas may have a flow rate into the chamber of from about 0.5 sccm to about 3 sccm, from about 0.5 sccm to about 2 sccm, or from about 1 sccm to about 2 sccm.

Figure 5:
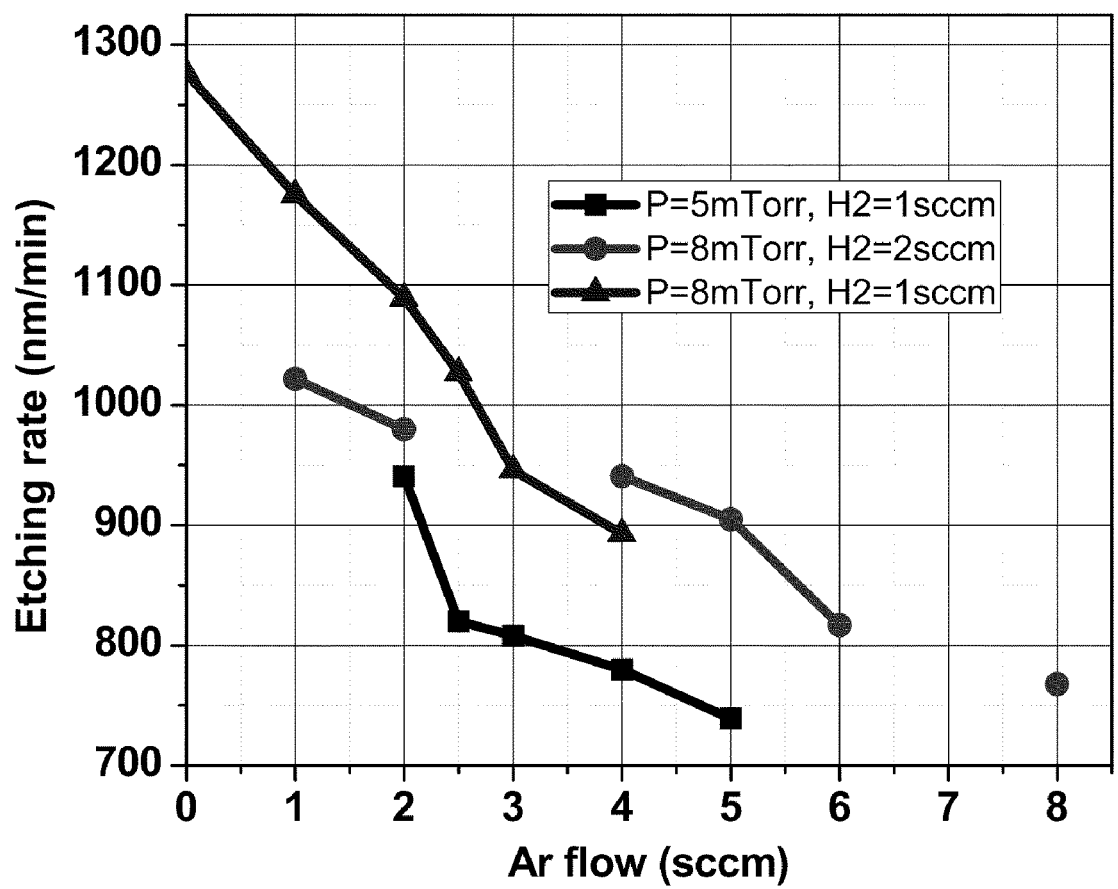
FIG. 5 shows etching rate as a function of Ar flow for various chamber pressures and flow rates of hydrogen into the process chamber.
Figures 6A, 6B:
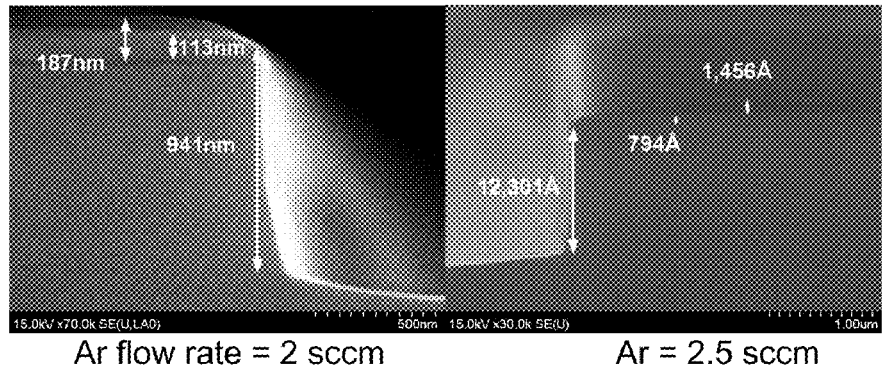
FIGS. 6A-6E are SEM images of GaAs etched mesas as a function of Ar flow rate for a chamber pressure of 5 mTorr and a $H_2$ flow rate of 1 sccm after two minutes of etching.
Figures 6C, 6D:
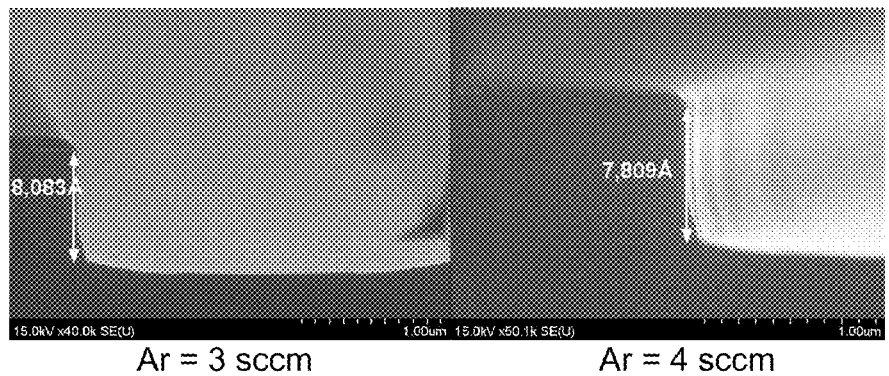
Figure 6E:
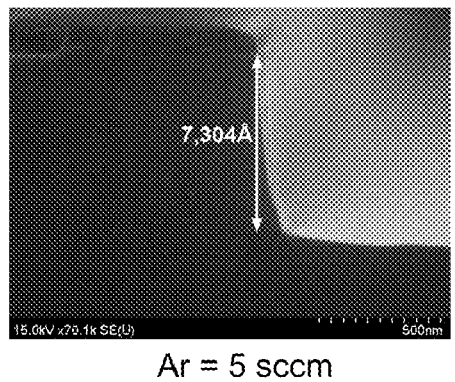
Figures 7A, 7B:
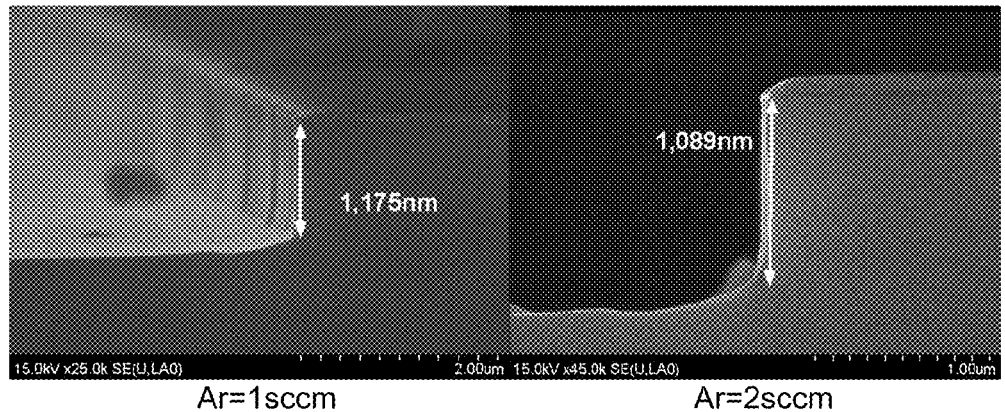
FIGS. 7A-7E are SEM images of GaAs etched mesas as a function of Ar flow rate for a chamber pressure of 8 mTorr and a $H_2$ flow rate of 1 sccm after two minutes of etching.
Figures 7C, 7D, 7E:
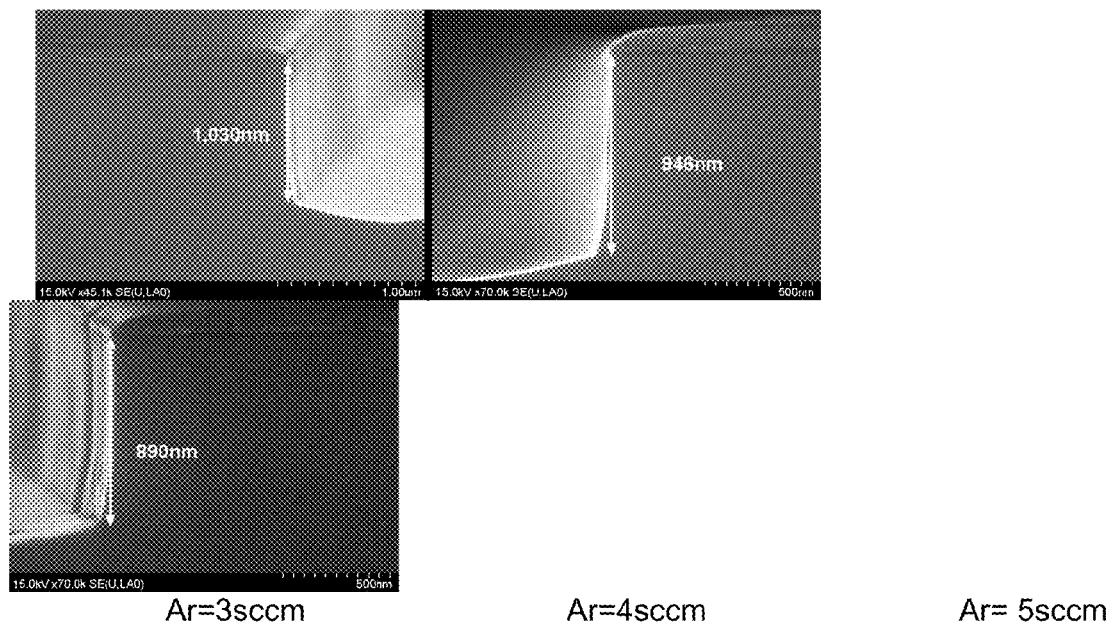
Figures 8A, 8B, 8C:
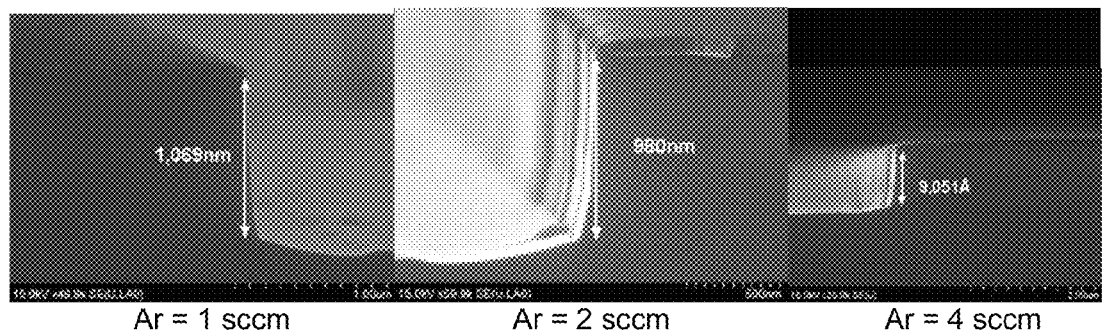
FIGS. 8A-8F are SEM images of GaAs etched mesas as a function of Ar flow rate for a chamber pressure of 8 mTorr and a $H_2$ flow rate of 2 sccm after two minutes of etching.
Figures 8D, 8E, 8F:
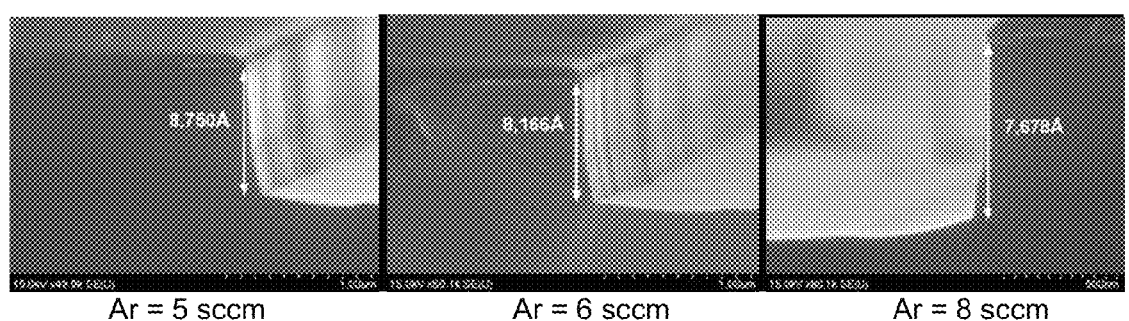

To improve the verticality of the etched profiles, the inventors varied the flow of Ar into the process chamber. FIG. 5 shows the etching rate as a function of Ar flow for various chamber pressures (5 and 8 mTorr) and $H_2$ flow rates (1 and 2 sccm). The etching rate decreases with increasing Ar flow rate, although the chamber pressure appears to be the more critical factor to influence the etching rate. The DC bias is higher when the chamber pressure is higher. The SEM images of FIGS. 6A-6E, 7A-7E, and 8A-8F show how the etched GaAs profiles vary as a function of Ar flow rate for the chamber pressures and $H_2$ flow rates of FIG. 5.

The inventors believe that Ar acts as a neutral buffer gas which reduces chemical etching but increases physical etching—the physical bombardment action of the plasma. Physical etching tends to produce trapezoidal shapes, while chemical etching may produce an undercut profile. Thus, by varying the Ar buffer gas, the inventors have discovered that they can balance the chemical and physical etching processes in order to produce sidewalls of increased smoothness and verticality. In general, the Ar gas may have a flow rate into the chamber of from about 1 sccm to about 8 sccm. It may be particularly advantageous for the flow rate of the Ar gas to be from about 3 sccm to about 5 sccm.

Figure 9A:
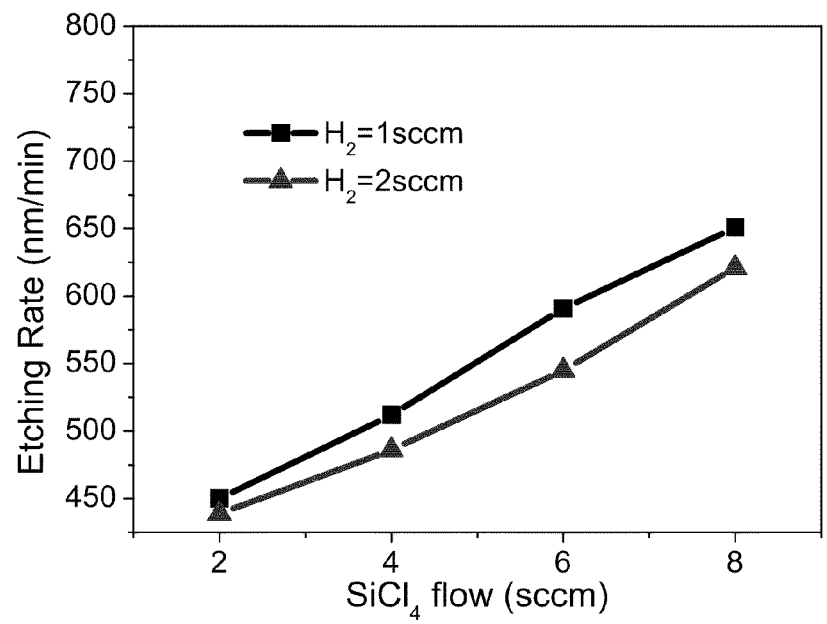
FIGS. 9A and 9B show etching rate as a function of $SiCl_4$ flow rate for various $H_2$ and Ar flow rates.
Figure 9B:
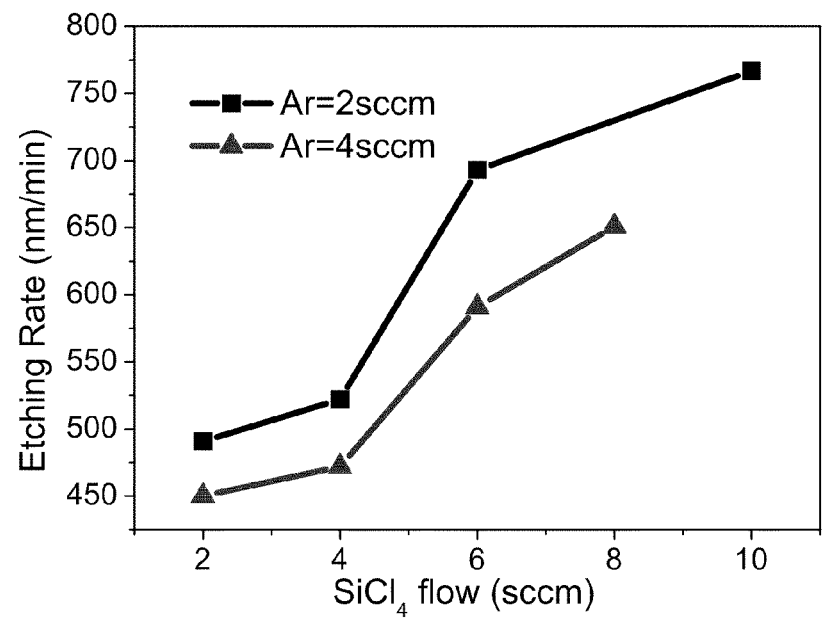

The etching rate as a function of the $SiCl_4$ flow rate for various $H_2$ and Ar flow combinations is shown in FIGS. 9A and 9B, respectively. FIG. 9A shows the etch rate corresponding to a flow rate of 1 sccm or 2 sccm of hydrogen, and FIG. 9B shows the etch rate corresponding to a flow rate of 2 sccm or 4 sccm of argon. Both graphs show that etch rate increases as the flow rate of $SiCl_4$ increases. Thus, with more $SiCl_4$ etching gas present in the chamber, GaAs is etched more quickly. At the same $SiCl_4$ flow, however, the etching rate decreases with increasing $H_2$ or Ar flow. The $SiCl_4$ gas may have a flow rate into the chamber of from about 2 sccm to about 8 sccm or from about 1 sccm to about 5 sccm. A flow rate of from about 2 sccm to about 5 sccm for the $SiCl_4$ gas may also be suitable.

Figure 10:
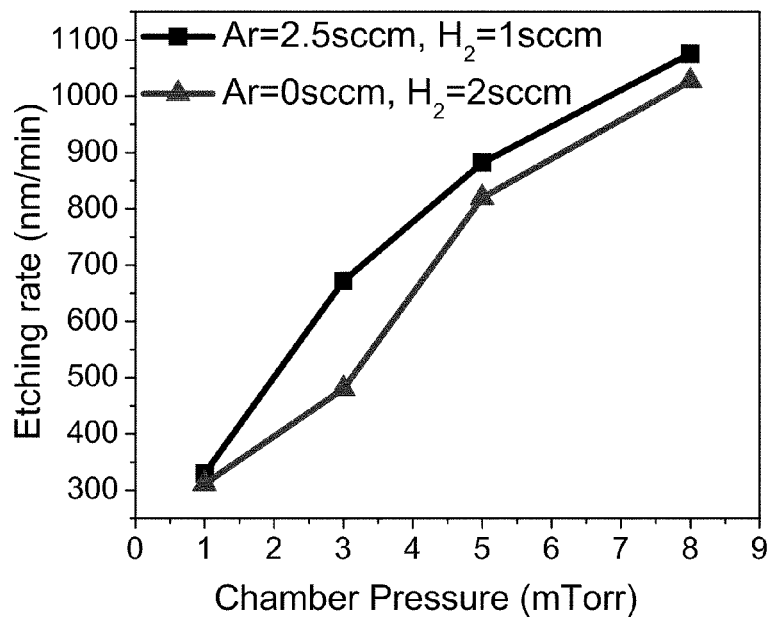
FIG. 10 shows etching rate as a function of chamber pressure for various $H_2$ and Ar flow combinations.

Referring to FIG. 10, the graph indicates that the etching rate increases with chamber pressure from less than about 350 nm/min at 1 mTorr to about 1.1 μm/min at 8 mTorr. At a higher chamber pressure, more etchant gases are present in the chamber and the etching rate correspondingly increases. However, the metal (mask) surface and the etched surface each show an increased level of roughness at high chamber pressures, indicating damage of the GaAs material and sputtering of the mask. The mesas are also damaged. Accordingly, the inventors believe that about 3 mTorr is an optimal pressure. Typically, the chamber pressure is maintained in the range of from about 1 mTorr to about 8 mTorr, and it may be preferable to maintain the chamber pressure at a level of from about 1 mTorr to about 5 mTorr.

Figure 11:
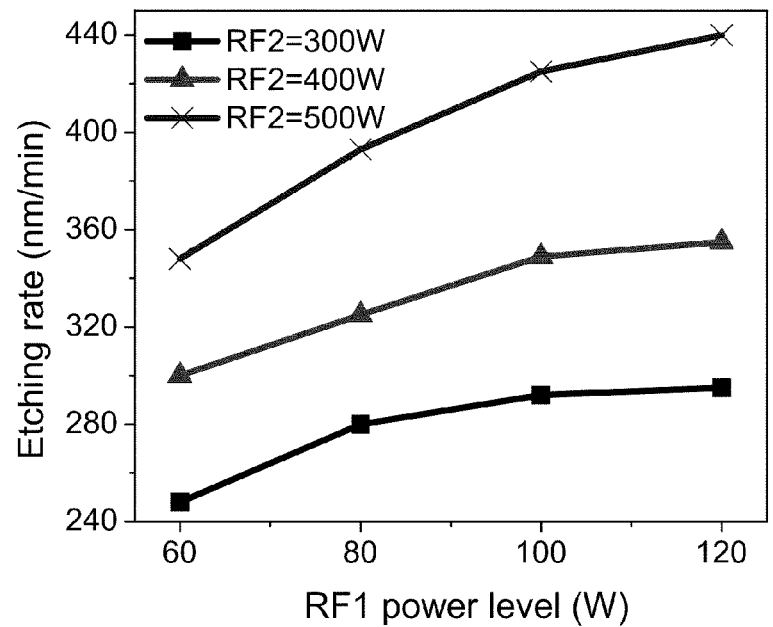
FIG. 11 shows etching rate as a function of RF1 power level for various RF2 power levels.

The dependence of GaAs etching rate on RF power levels is shown in FIG. 11. The etching rate increases with increasing RF1 or RF2 power level, where RF1 is the RF power supply for the platen or chuck, and RF2 is the power supply for the set of coils that generate the plasma (the source electrode). In order to keep the plasma stable, the inventors set the RF2 power level to 300 W, 400 W and 500 W in a series of experiments. For each RF2 power level, the RF1 power level was set to 60 W, 80 W, 100 W, and 120 W.

The etching rate increases with increasing RF1 power due to the increase in ion energy. Increasing the RF2 power level also results in an increased etching rate due to the increase in both ion energy and plasma density. Both RF1 and RF2 power influence the etching profile, but the RF1 power is more critical. Since RF1 powers the platen, the RF1 power affects the DC bias (the potential across the coil and the sample). The RF1 power level is preferably set so as to minimize etch damage to the sample. The platen is typically powered at an RF1 power level that lies in one or more of the following ranges: from about 60 W to about 150 W, from about 60 W to about 120 W, or from about 90 W to about 120 W. The source electrode is typically powered at an RF2 power level that lies in one or more of the following ranges: from about 100 W to about 600 W, from about 100 W to about 500 W, from about 400 W to about 600 W, or from about 300 W to about 500 W.

Figure 12:
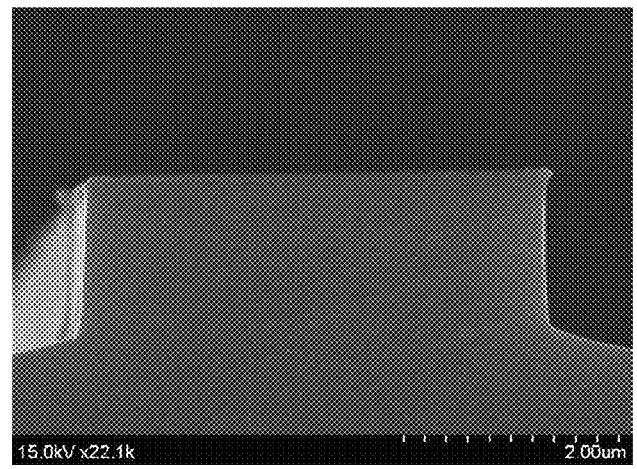
FIG. 12 shows an SEM image of an etched mesa prior to removing the etching mask.
Figure 13:
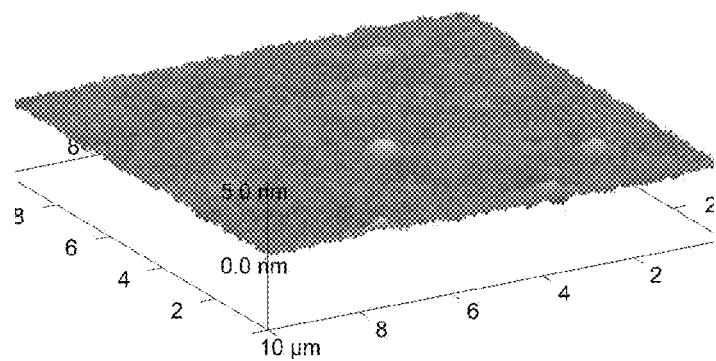
FIG. 13 is an atomic force microscope (AFM) image of an etched GaAs sample.

FIG. 12 shows an SEM image of the GaAs etched mesa before removing the etching mask. The etched mesa is vertical and the surface of the mask is still smooth, which indicates that there is substantially no metal sputtering during the etching process. The etched structure was obtained at an etching rate of 468 nm/min under the following conditions: a $SiCl_4$ flow rate of 2 sccm, an Ar flow rate of 4 sccm, a $H_2$ flow rate of 1 sccm, a chamber pressure of 3 mTorr, an RF1 power of 120 W, and an RF2 power level at 500 W. A sample was etched for a time duration of 10 minutes using these parameters. An AFM image of the sample is shown in FIG. 13. The rms roughness is 0.16 nm over a 10 μm×10 μm scanning area. To the inventors' knowledge, this is the lowest rms roughness of an etched GaAs surface for an etch depth of over 4.5 μm. The surface roughness of the GaAs surface processed using the etching method described herein is comparable with that of an epi-ready wafer.

Accordingly, a suitable range of process parameters for high-rate etching of a Ga-based compound semiconductor may be: a $SiCl_4$ flow rate of from about 1 sccm to about 5 sccm, an Ar flow rate of from about 3 sccm to about 5 sccm, a $H_2$ flow rate of about 0.5 to about 2 sccm, a chamber pressure of from about 1 mTorr to about 5 mTorr, an RF1 power of from about 90 W to about 150 W, and an RF2 power level of from about 400 W to about 600 W.

Besides the above-described process parameters, the inventors have found that the composition of the mask has an impact on the etching profile. In particular, the inventors have recognized shortcomings with existing masks made of, for example, $SiO_2$ or a single layer of Cr. With the addition of hydrogen to the process gases, hydrochloric acid (HCl) is produced during etching as described in Equation 1 above. Since HCl attacks some mask materials, the selectivity between the mask and GaAs may be reduced when $H_2$ is present, and the beveled shape of the mask may be transferred to the GaAs mesa. For example, using a $SiO_2$ mask with an Ar flow rate of 0 sccm and $H_2$ flow rate of 2 sccm, the mesa angle is 113 degrees. To overcome this problem and improve the etching profile, the inventors developed masks including at least one metal layer overlying the masked portions of the sample. Advantageously, at least two metal layers overlie the masked portions of the sample. Preferably, the masks are based on layers of nickel and chromium.

The sample preparation entails patterning a GaAs wafer with photolithography and depositing a 20-nm layer of Ti on the patterned surface to enhance the adhesion between the compound semiconductor and the metals. Next, a 20 nm-layer of Ni and a 100 nm-layer of Cr are deposited on the Ti layer. The thickness of each of the titanium layer and the nickel layer may lie in the range of from about 10 nm to about 30 nm, and the chromium layer is preferably from about 80 nm to about 120 nm thick. After liftoff, the remaining Ni/Cr forms the etching mask.

Figures 14A, 14B, 14C:
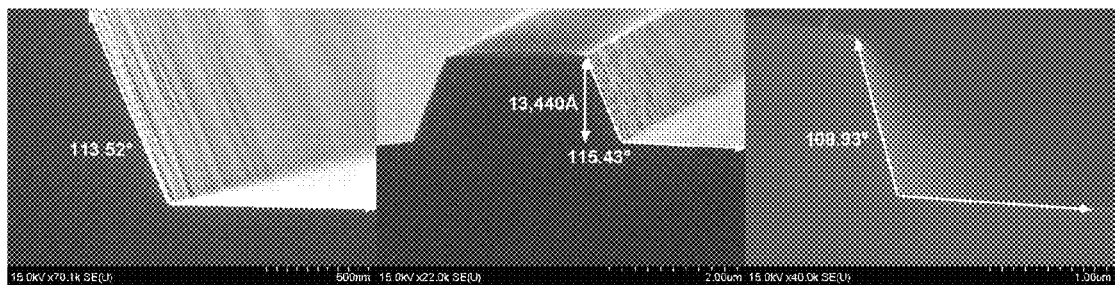
FIGS. 14A-14C show SEM images of a mesa formed at different chamber pressures (1, 3 and 5 mTorr, respectively) using a $SiO_2$ etching mask.
Figures 15A, 15B, 15C:
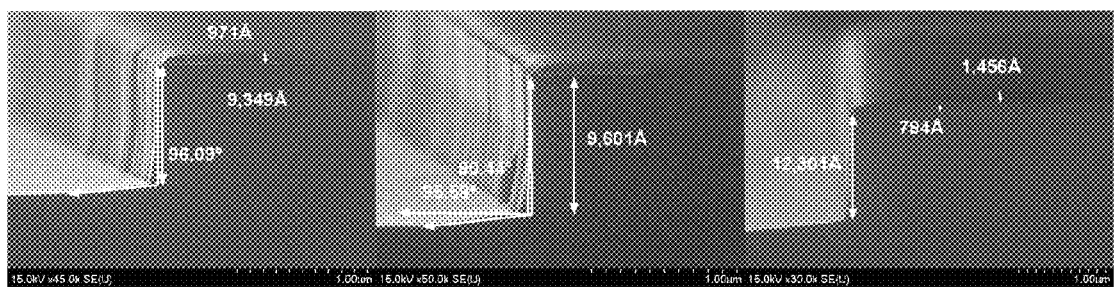
FIGS. 15A-15C show SEM images of a mesa formed at different chamber pressures (1, 3, and 5 mTorr, respectively) using a Ni/Cr etching mask.

FIGS. 14A-14C show SEM images of a mesa formed at different chamber pressures (1, 3 and 5 mTorr, respectively) using a $SiO_2$ etching mask, and FIGS. 15A-15C show SEM images of a mesa formed at different chamber pressures (1, 3, and 5 mTorr, respectively) using the improved Ni/Cr etching mask. As can be seen, the verticality of the mesa structures is substantially increased with the Ni/Cr mask.

Low Rate Etching Process

The inventors have developed a low-rate plasma etching process for Ga-based compound semiconductors that has the advantages of large area uniformity and minimal etch damage. A low etching rate is beneficial for precisely controlling the depth of distributed Bragg reflector (DBR) gratings in several devices, e.g., tunable lasers, sensors, or optical logic gates. The desired etch depth is typically about 35 nm; thus, a low etch rate of tens of nanometers per minute or less is desired for timed etches that yield accurate and repeatable results.

Figure 16:
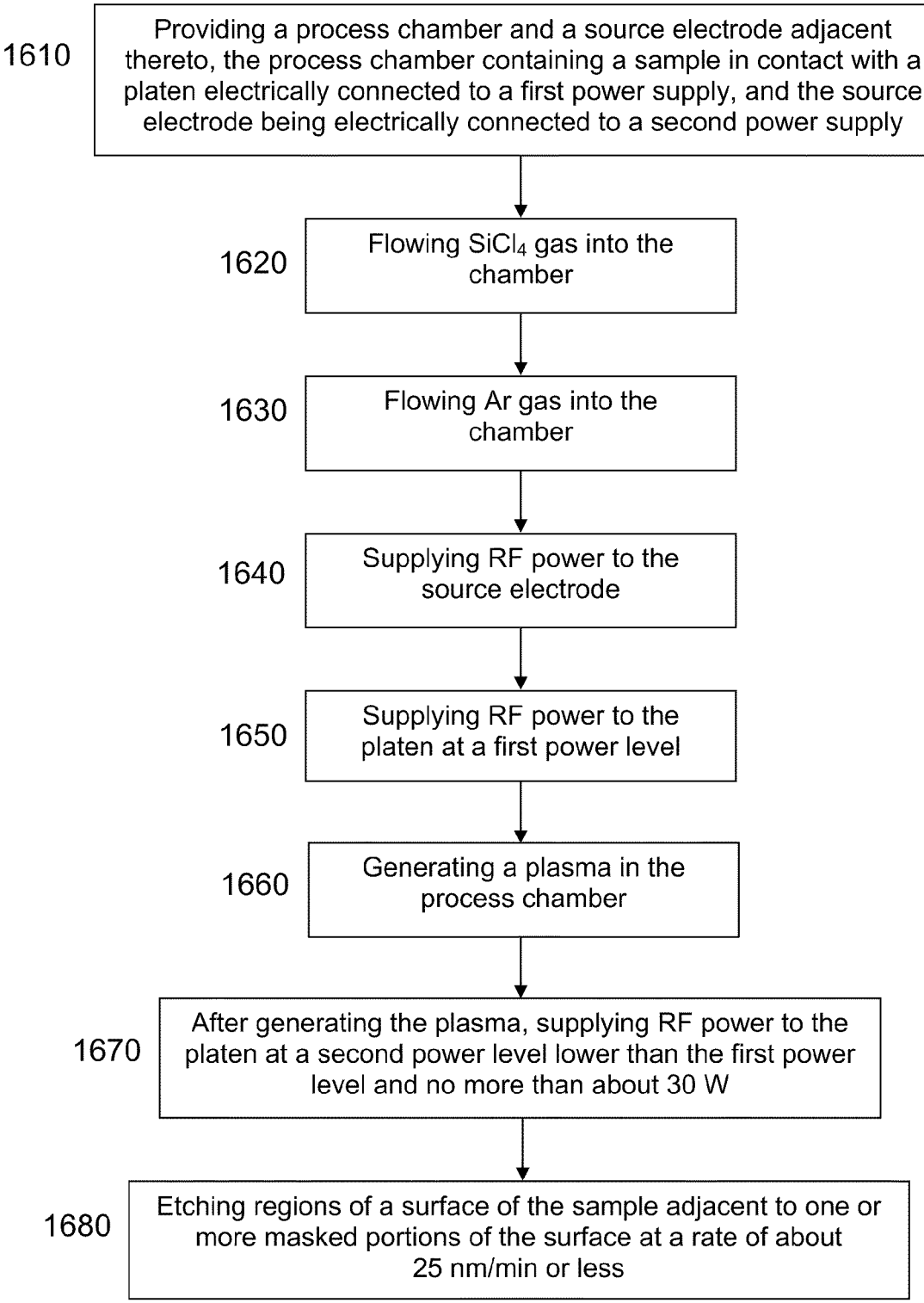
FIG. 16 is a flow chart showing steps in one embodiment of a method of plasma etching Ga-based compound semiconductors.

Referring to the flow chart of FIG. 16, the method includes providing 1610 a process chamber containing a sample comprising a Ga-based compound semiconductor. The sample is in contact with a platen which is electrically connected to a first power supply. A source electrode (e.g., the set of coils 120 shown in FIG. 1) which is electrically connected to a second power supply is adjacent to the process chamber. The method includes flowing SiCl$_4$ gas into the chamber 1620 and flowing Ar gas into the chamber 1630. RF power is supplied to the source electrode 1640, and RF power is supplied to the platen 1650 at a first power level. A plasma is generated 1660 based on the gases in the chamber. After the plasma is generated, the platen is powered at a second power level 1670 which is lower than the first power level and preferably no higher than about 30 W. Regions of a surface of the sample adjacent to one or more masked portions of the surface are etched 1680 by the plasma at an etching rate of about 25 nm/min or less to create a substantially smooth etched surface.

It is desirable that the substantially smooth etched surface extends over large areas of the sample. For example, the substantially smooth etched surface may have an rms roughness of about 0.4 nm or less and extend over a 10 μm×10 μm area. Preferably, the rms roughness is about 0.3 nm or less over the 10 μm×10 μm area. It is also preferred that etched features (e.g., mesas) have substantially vertical walls.

Previous efforts to obtain a low etch rate of Ga-based compound semiconductors have been hampered by the difficulty of generating a stable plasma at low power levels. The inventors have discovered that by supplying RF power to the platen at a higher initial power level (first power level) and then switching over to a lower power level (second power level) within several seconds, it is possible to ignite and maintain a stable plasma without causing etch damage to the sample. Ideally, the platen is powered at the first power level only for the time needed to attain stable plasma operation, and then the RF power is reduced to the second power level to achieve the desired low-rate plasma etching. The first power level may be employed for a time duration of about 5 seconds or less before switching to the second power level, which may be less than 30 W, as will be discussed in greater detail below. The first power level is generally at least about 35 W, and may be in the range of from about 35 W to about 100 W.

Low power operation leads to reduced ion energies, which, besides promoting a low etching rate, help to minimize etch damage to the sample and improve the smoothness of the etched surface. Preferably, the etching rate is about 20 nm/min or less, or about 15 nm/min or less.

The surface profile and smoothness of the etched samples and the etching rate of the plasma may depend on the process gases and their flow rates, the chamber pressure, the etch time, and the RF power applied to the platen (RF1 power level) and to the source electrode (RF2 power level). These process parameters are discussed in detail below in reference to a series of etching experiments conducted by the inventors on GaAs samples.

The inventors employed a PlasmaTherm SLR 770 ICP-RIE system to carry out a series of etching experiments. Prior to etching, a GaAs sample was patterned into stripes having widths of 2 μm, 3 μm, 5 μm, and 10 μm by photolithography. A hard etching mask (e.g., 50 nm-thick SiO$_2$ or 20 nm-thick Ti) was deposited on the wafer, followed by CF$_4$ plasma rapid ion etching (RIE). After removing the remaining photoresist, the wafer was cleaved into small pieces and transferred to the ICP system for etching.

In the series of etching experiments, an rf bias (13.56 MHz) and an inductive power (2 MHz) in the range of 0-1000 W were applied to the platen and source electrode (coils). The chamber pressure was controlled by a feedback-controlled throttle valve. Process gases were introduced into the chamber with a series of mass flow controllers calibrated to flow rates as low as 0.1 sccm.

The etched mesas and etching rates were characterized using a Hitachi S4800 scanning electron microscope (SEM) to provide a cross-sectional view of the cleaved strips. The surface roughness was measured with a Digital Instruments Dimension 3000 atomic force microscope (AFM).

FIGS. 17A-17D show etching rate and DC bias as a function of RF2 power with various Ar flow rates for different RF1 power levels. In the following discussion, "RF1 power level" or "RF1 power" refers to the lower RF1 power level (the second power level) applied to the platen which is sustained during the etching process. The DC bias is the voltage potential measured across the platen and the coils.

Figure 17A:
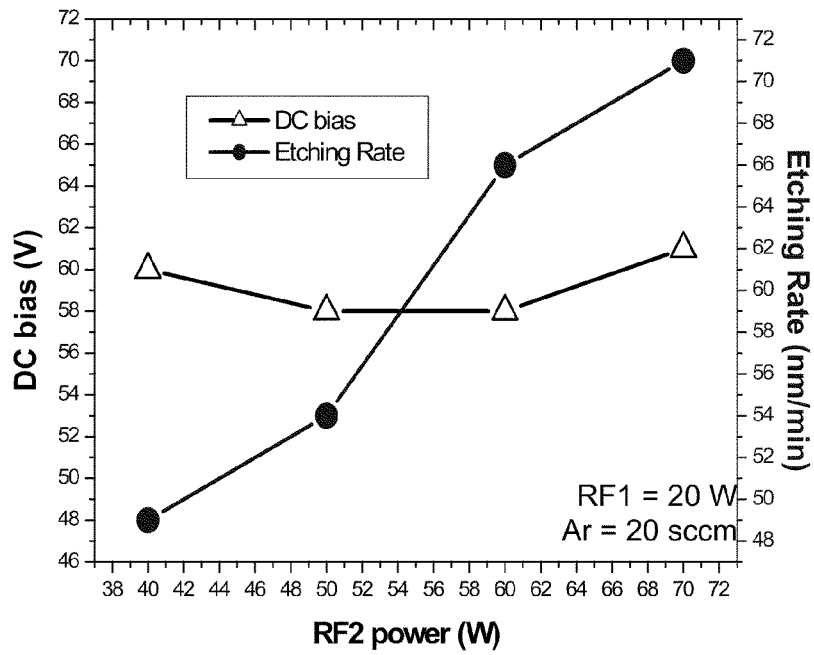
FIGS. 17A-17D show DC bias and etching rate as a function of RF2 power for different combinations of RF1 power and Ar flow rate.
Figure 17B:
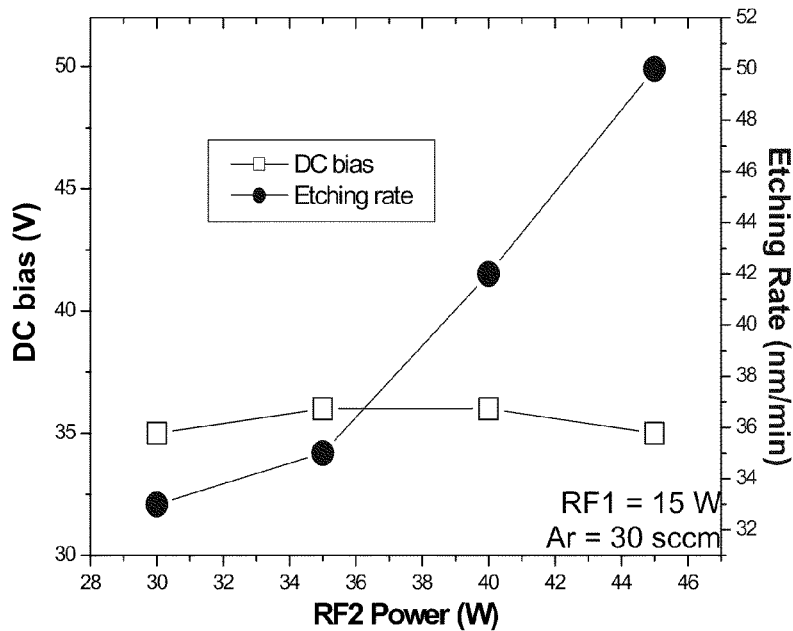
Figure 17C:
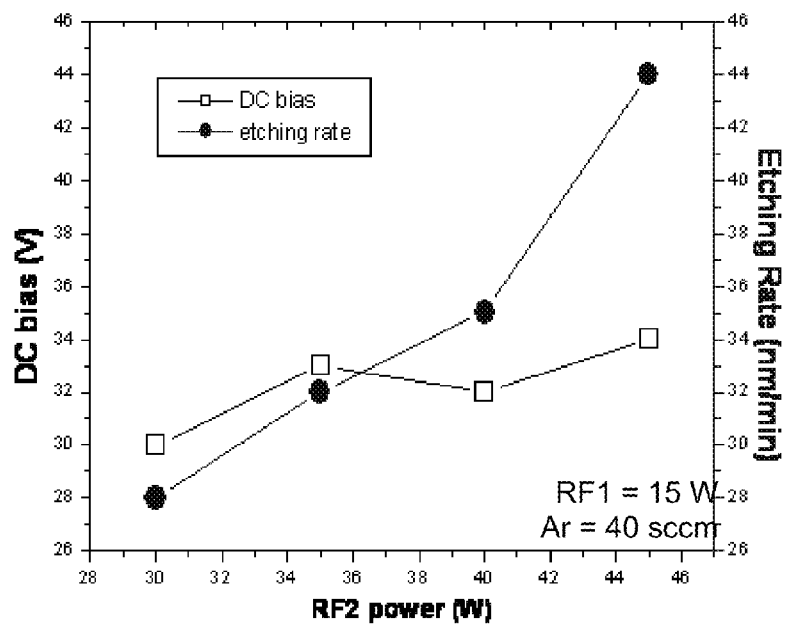

To promote large area uniformity, the flow rate of SiCl$_4$ was set to 1 sccm and the chamber pressure to 1 mTorr. In the first run, the flow rate of Ar was set to 20 sccm, the RF1 power level was set to 20 W, and the RF2 power level was varied. As shown in FIG. 17A, the etching rate decreased when the RF2 power level decreased. An etching rate of 48 nm per minute was achieved with a RF2 power level of 40 W. The RF2 power level is preferably about 30 W or less. For example, the RF2 power level may be in the range of from about 20 W to about 30 W, or from about 15 W to about 25 W.

Figure 17D:
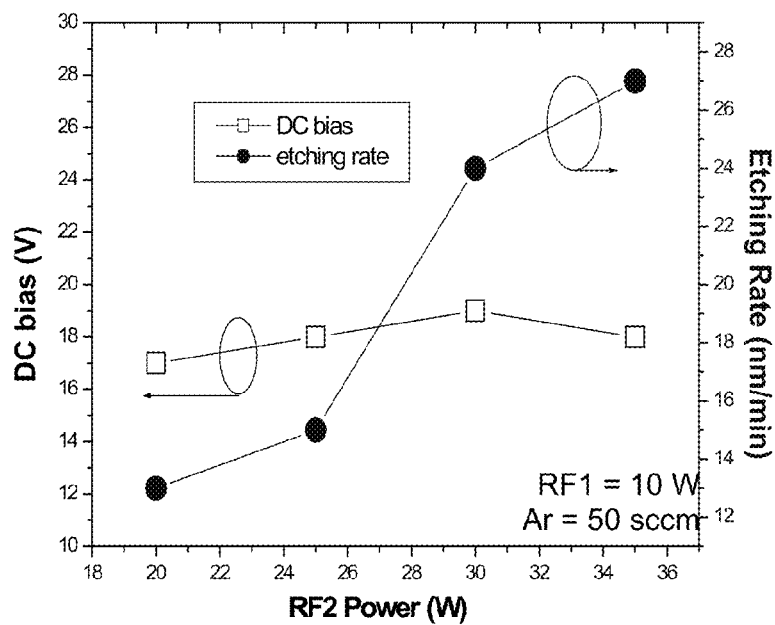
Figures 20A, 20B:
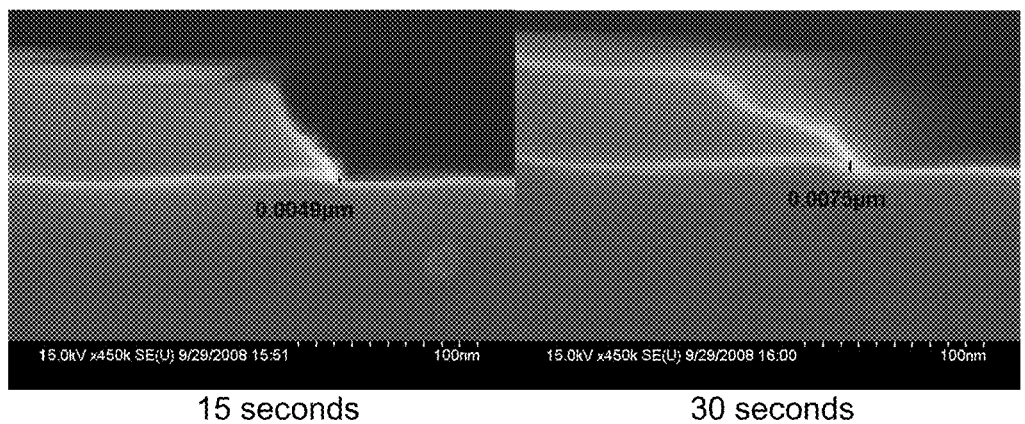
Figures 20C, 20D:
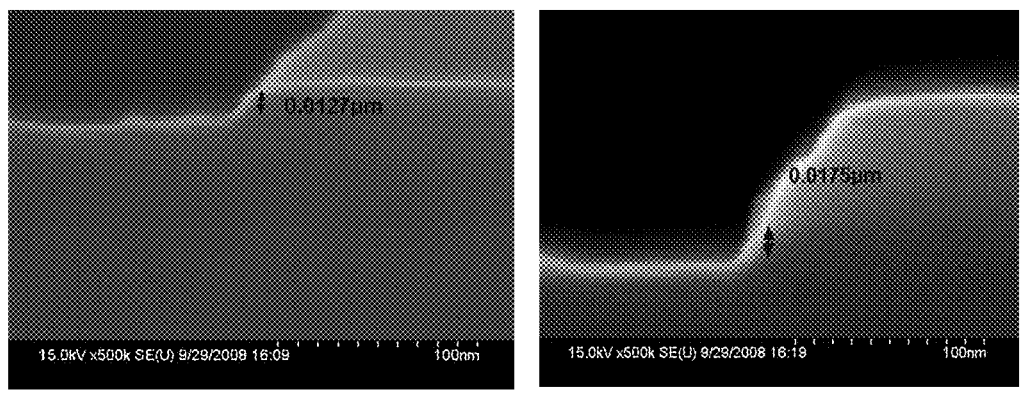
Figures 20E, 20F:
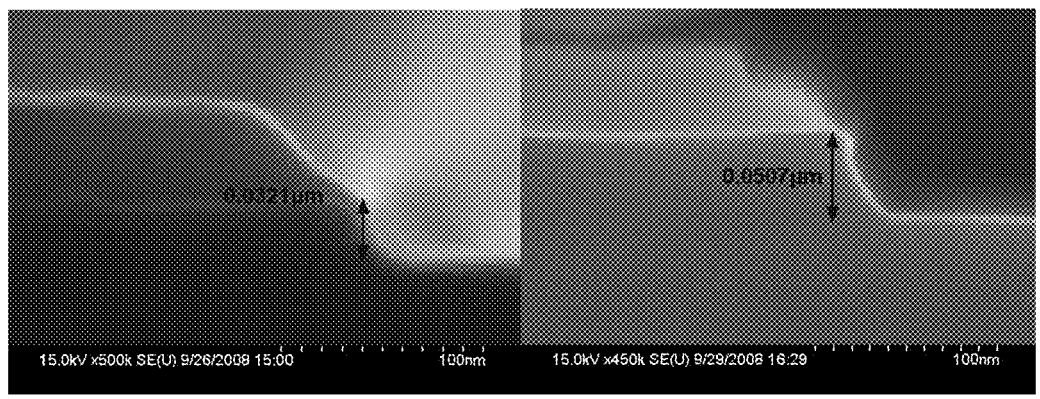

In an effort to further reduce the etching rate, the flow rate of Ar was increased. The inventors believe Ar acts as a buffer in the etching process that can modify the etching profile, surface smoothness, and even the etching rate. A flow rate of Ar of 30 sccm, 40 sccm, or 50 sccm was employed in the next three runs, the results of which are presented in FIGS. 17B, 17C, and 17D, respectively. With a 50 sccm Ar flow, an etching rate as low as 13 nm per minute was achieved when the RF1 and RF2 power levels were 10 W and 20 W, respectively, as shown in FIG. 17D. This rate is believed to be sufficiently slow for high-accuracy timed etching of the gratings.

FIGS. 17A-17D show that the DC bias remains approximately constant versus RF2 power, but varies as a function of RF1 power and Ar flow. Comparing FIGS. 17B and 17C, it can be seen that the DC bias did not change significantly (remained in the range of 30 V to 35 V) even as the Ar flow changed from 30 sccm to 40 sccm. The RF1 power is the same (15 W) in FIGS. 17B and 17C. Comparing FIGS. 17A, 17B and 17D, it can be observed that the DC bias decreases as the RF1 power decreases. The DC bias is 60 V at an RF1 power of 20 W, and it drops to 35 V at an RF1 power of 15 W to 18 V at an RF1 power of 10 W. Thus, the DC bias was determined largely by the RF1 power. In summary, there is not a significant change in the etching rate and in the DC bias at fixed RF1 power levels when the Ar flow is in the range of 20 sccm to 30 sccm.

In the fifth run, the RF1 power was fixed at 10 W, the RF2 power at 20 W, and the chamber pressure at 1 mTorr, respectively, and the Ar flow was varied from 1.3 sccm to 50 sccm. The etching time was fixed at 2 minutes. The SEM images of FIGS. 18A-18J show etched profiles obtained at various Ar flow rates (in sccm), as indicated below the images.

There are two etching effects during plasma etching: chemical etching, which may induce undercut etching, and physical etching, which induces vertical etching by ion bombardment. Physical bombardment may damage the etching surface but may also give the desirable anisotropic vertical etch. The SEM images of FIGS. 18A-18E show that in the low Ar flow regime, e.g., when the Ar flow is less than 20 sccm, the etching is dominated by chemical etching. The side wall of the etched profile shown in each SEM image is visibly undercut due to Cl-based etching. When the Ar flow is increased from 20 sccm to 34 sccm, chemical etching, where Ar acts as a buffer of the etching process, becomes less and less significant, and the etching rate decreases accordingly. At the same time, the side wall becomes more vertical, as shown in FIGS. 18F-18I due to increased physical etching. When the Ar flow increases again, physical bombardment becomes dominant and chemical etching is reduced due to the ultra-low $SiCl_4$ concentration. The bevel shape of the side wall shown in FIG. 18J may be due to pattern transfer from the sidewall shape of the $SiO_2$ etching mask. For Ar flows of larger than 38 sccm, the etching rate saturates even though the Ar flow is increased. Also, the chamber pressure increases when the total etching gas flow is increased, despite being set to 1 mTorr due to the limited capability of the turbo pump. Since the etching rate increases with increasing chamber pressure, this balance may have induced the saturation of the etching rate at high Ar flow rates. It appears that the optimal Ar flow rate is from about 18 sccm to about 34 sccm, as suitable etching rates and etching profiles have been obtained in this regime. It may be also advantageous for the flow rate of Ar gas to be from about 22 sccm to about 30 sccm, or from about 24 sccm to about 28 sccm. The inventors believe that the addition of $H_2$ gas to the plasma may be beneficial in some cases.

A controllable and constant etching rate is highly desired in practical processes. For example, if the etching rate is constant, it may be possible to precisely calculate the total etching time prior to etching using calibration data from a test sample. Thus, the ICP etching rate of GaAs material was also investigated as a function of etching time. GaAs samples were prepared as described above. In order to investigate the time dependent etching rate, the etching time was set to 15, 30, 45, and 60 seconds, and 2, 3, 5, and 8 minutes. An etch recipe of $SiCl_4$=1 sccm, Ar=26 sccm, chamber pressure=1 mTorr, and $RF_1/RF_2$=10/20 W was employed in the series of experiments.

FIG. 19 shows the time-dependent etching depth and etching rate obtained from the SEM images of FIGS. 20A-20H. The etching depth increases linearly over the full range, which means that the etching rate is roughly constant. The etching rate varies a small amount during the first 60 seconds. Also, from the SEM pictures, it can be seen that the etched surface is rougher over short time durations than over longer time durations. As time progresses, the plasma state and the etching rate become more stable, and the etch depth is larger compared to the monolayer thickness; thus, the surface becomes smoother.

The SEM images of FIGS. 20A-20H show GaAs etched profiles obtained over various etch times. The figures indicate that the etching rate of GaAs with $SiCl_4$/Ar plasma is about 15-17 nm/min within the range of from 1 minute to 8 minutes. Although GaAs was etched at the same rate within the first minute, the surface of the GaAs material was rough. This may be due to either instabilities in the $SiCl_4$ plasma immediately after ignition or the fact that the number of monolayers etched is quantized: there are only ~14 crystal lattice unit cells removed during an 8 nm etch.

FIG. 21 shows the etching rate of GaAs and the real chamber pressure as functions of Ar flow rate. The etching rate was calibrated with GaAs samples having $SiO_2$ etching masks, and the ICP etching parameters were set as follows: $SiCl_4$=1 sccm, RF1=10 W, RF2=20 W, chamber pressure=1 mTorr, and Ar flow rate from 0-46 sccm. FIG. 21 may be divided into three regions according to the Ar flow rate. In region I, where the Ar flow rate was from 0 sccm to 20 sccm, the etching rate drops drastically from 62 nm/min to 22 nm/min with increasing Ar flow. SEM of the cross-sectional views shows that the etched profile is undercut, which suggests that the etching process is dominated by chemical etching. The physical etching process, due mainly to Ar ion bombardment, becomes more and more significant with increasing Ar gas flow. Chemical etching and physical etching are balanced in region II, where the sidewall of the etched mesa is vertical and the etching rate is stable from about 15 nm/min to about 20 nm/min. In region II, the etching rate and mesa profile are both optimized. When the Ar flow continues to increase, the mesa takes on a beveled shape, which might be attributable to the $SiO_2$ etching mask. Intuitively, the etching rate might be expected to go down, but from the figure it can be seen that the chamber pressure increases linearly with the Ar flow from region II due to the inability of the turbo pump in the ICP system to keep up with the Ar flow. Due to the combination of the above two effects (increased Ar flow rate and chamber pressure), the final etching rate is constant in region III.

Based on the above analysis, the inventors selected an etching recipe of $SiCl_4$=1 sccm, Ar=26 sccm, RF1=10 W, RF2=20 W, and chamber pressure=1 mTorr for etching a shallow grating at a low etching rate. The shallow grating was prepared by spin-coating PMMA e-beam resist on a GaAs substrate with a thickness of 100 nm after baking. Then the sample was transferred into an e-beam lithography system. The electron beam dose level was 350 $\mu C/cm^2$. A MIBK:IPA=3:1 mixture was utilized as the developer, and the sample was rinsed in IPA after development. A 20 nm thick layer of Ti was deposited on the sample with the e-beam evaporation system, and it was soaked in acetone for 2 hours for the liftoff process. A GaAs grating with a titanium etch mask was obtained.

The low rate etching process was carried out for two minutes on the grating. Afterwards, the GaAs sample was soaked in HF for 2 minutes to remove the 20 nm Ti etching mask. Atomic force microscopy (AFM) was used to examine the etched morphology of the grating because the 30 micron length of the sample was too short for cleaving in the middle to examine by SEM.

Figure 22A:
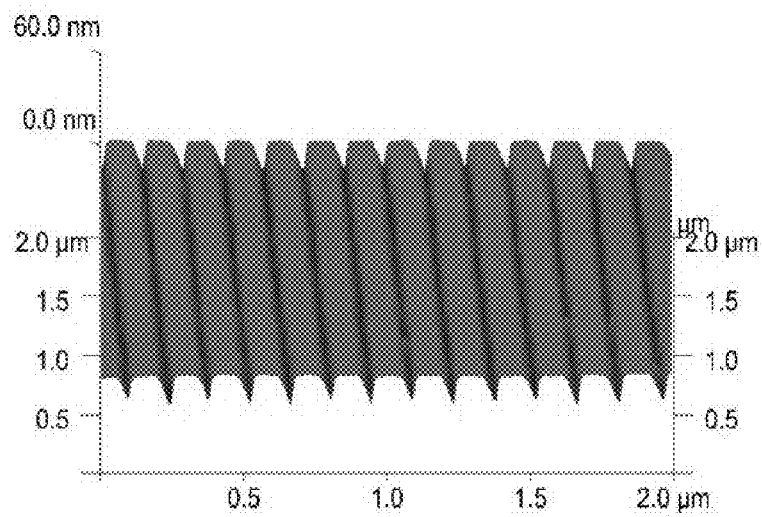
FIGS. 22A and 22B show a three-dimensional AFM image and cross-sectional profile of a 140 nm period shallow etched grating in a 2 μm×2 μm area.
Figure 22B:
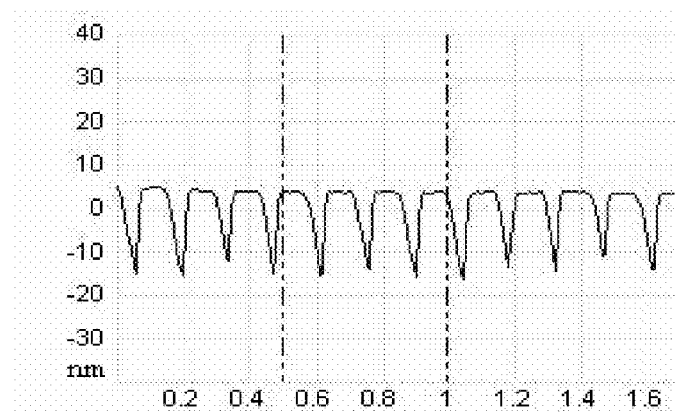

FIGS. 22A and 22B show a three-dimensional AFM image and cross-sectional profile of a shallow etched grating in a 2 $\mu m \times 2 \mu m$ area. It can be seen that the etching depth was about 20 nm, which is lower than expected. The etch rate of the calibration sample was 17 nm per minute. There could be several explanations for this inconsistency. First, the AFM tip might be too wide to penetrate into the grating valleys to measure the full depth. An alternate explanation is that there is a lag effect of plasma etching, where the etching rate of the semiconductor material is influenced by the size of the etch opening. Smaller openings result in slower etch rates, and the etching width of the calibration sample was about 3 microns whereas the etching opening of the grating was about 60 times smaller, around 50 nm. The etched area has a period of 140 nm, which matches the e-beam lithography pattern design. The duty cycle is about 38% due to slight over-exposure in the e-beam lithography process. The rms roughness over a 10 $\mu m \times 10 \mu m$ area was measured to be about 0.32 nm, which is sufficient for upper cladding regrowth in DBR lasers. In further trials, the etching time may be increased to ensure the correct etching depth and/or a finer AFM tip may be employed for the characterization. Generally, an etch depth ranging from about 5 nm to about 200 nm is desired. Also, the etching time in HF may be lengthened in order to ensure that all the Ti etching mask is removed prior to regrowth.

An advantage of the low-rate etching process is that the active layers below the etched region experience minimal damage due to the low RF power used in the etch. To investigate this claim, the inventors carried out photoluminescence (PL) measurements and compared the peak position, peak intensity, and full width at half maximum (FWHM) before and after the low-rate etching process.

Figure 23:
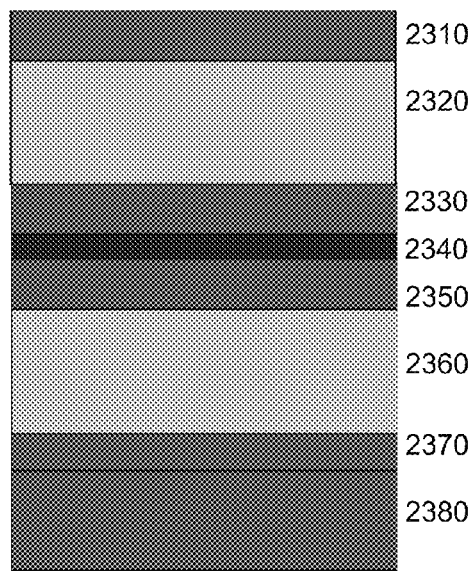
FIG. 23 shows schematically the epitaxial structure of a test specimen.

The epitaxial (epi) structure of an exemplary sample 2300 is shown in FIG. 23. All layers except the substrate 2380 are undoped. First, the GaAs cap layer 2310 (100 nm thick) and the upper AlGaAs cladding layer 2320 (1500 nm thick, Al graded 10%-30%) are selectively removed with a wet etch. Then, the wafer 2300 is cleaved into several samples. Next, the low-rate dry etch process is applied to the upper GaAs core 2330 (130 nm thick), which overlies an In0.2Ga0.8As quantum well layer 2340 (8 nm thick), and a lower GaAs core layer 2350 (130 nm thick). Below the lower core layer 2350 is another AlGaAs cladding layer 2360 (1500 nm thick, Al graded 30%-10%), a GaAs buffer layer 2370 (100 nm thick), and the GaAs substrate 2380. The etching recipe is $SiCl_4=1$ sccm flow rate, Ar=34 sccm flow rate, $RF_1=10$ W, $RF_2=20$ W, chamber pressure=1 mTorr, and the etching times for the samples are 0, 1, 3, 5, and 7 min, respectively. The etching rate is 16 nm/min, and thus the remaining GaAs core thicknesses are approximately 130, 114, 82, 50, and 18 nm, respectively.

Figure 24:
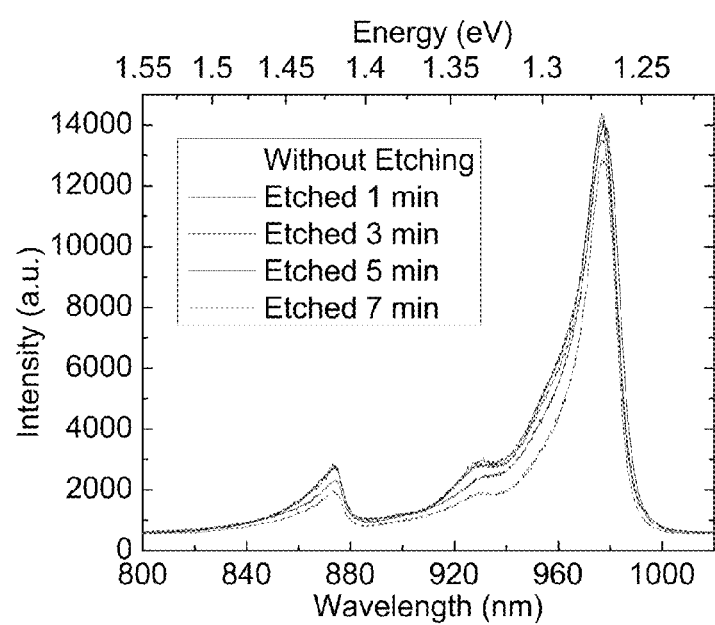
FIG. 24 shows photoluminescence (PL) spectra from a test specimen before and after etching.

FIG. 24 shows the PL spectra of the samples before and after dry etching. The etching does not appear to have produced significant material degradation. Each spectrum has its peak position within 0.2 nm of 976.6 nm. This variation is negligible when compared to the 0.2 nm step size of the PL instrument as well as the non-uniformity in PL peak across the unetched wafer. The 976.6 nm peak is due to the $E^1$-$HH^1$ transition, which is the lowest energy transition for the 8 nm InGaAs quantum well (QW) 2340. The peak near 929 nm is attributed to the $E^1$-$LH^1$ and/or the continuum-$HH^2$ transition. The excitation light from the Ar source at 488 nm is severely attenuated by the GaAs waveguide core 2350 and AlGaAs lower cladding 2360 and does not reach the substrate 2380. Thus, the peak at 870 nm is due to recombination in the GaAs core 2330 and 2350. The peak and integrated intensities are comparable for all etches except the deepest etch. In fact, there is a slight 3-5% increase in integrated intensity for the 1, 3, and 5 min etched samples compared to the unetched sample. This increase is likely due to improved pumping of the quantum well because of reduced absorption in the top GaAs core 2330. The FWHMs are 18.9, 20.0, 19.7, 19.8, and 16.1 nm (24.6, 26.2, 25.8, 25.9, and 20.9 meV), respectively. This variation is also negligible except for the narrower FWHM of the deepest etched sample. The reduced FWHM and 17% lower integrated intensity for the deepest etched sample imply that the QW carrier density is lower, especially since most of the intensity reduction is on the high energy side of the main peak.

There may be several causes for this decrease in QW carrier density: (1) a lower pump intensity incident on the QW layer 2340 due to interference effects from the cavity formed by the air-GaAs and GaAs—$In_{0.2}$GaAs interfaces ($\lambda/4n=28$ nm), (2) an increase in non-radiative recombination since the surface states are now much closer to the active region, or (3) deterioration of the active region itself. There may also be an increase in the reflection into the substrate of the emitted light due to the change in the cavity above. Despite the lower QW carrier density in the deepest etched sample, the inventors believe that the damage to the active region from the dry etching process is very slight at most. Additional PL tests with a 915 nm light source, which would not be absorbed by GaAs, were carried out to rule out some of these measurement artifacts, but the measured PL signal was too weak to be detected due to the thin absorbing region (only 8 nm) and the reduced absorption coefficient at 915 nm compared to 488 nm.

Ultra-Low Rate Etching Process

Figure 25:
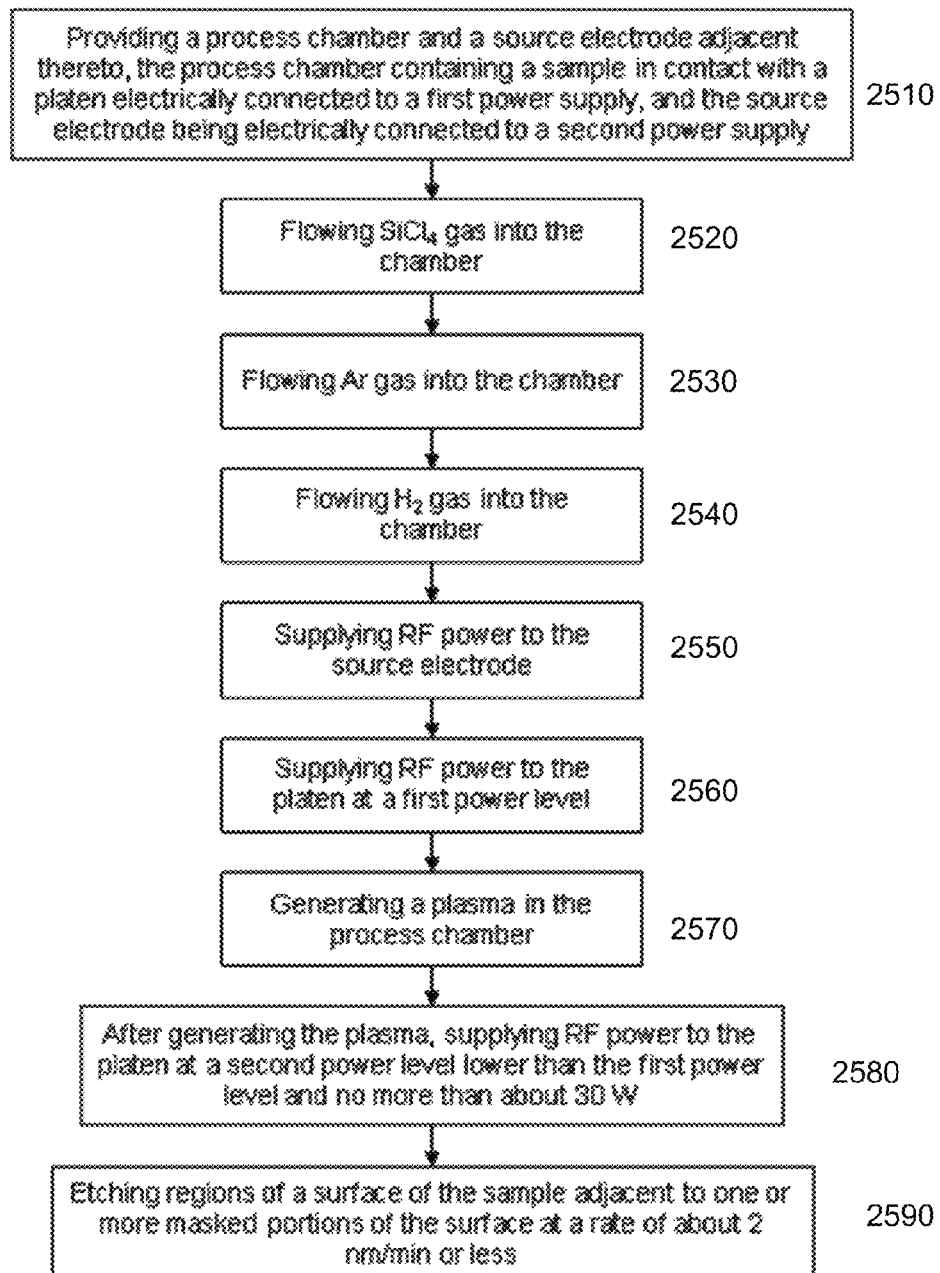
FIG. 25 is a flow chart showing steps in one embodiment of a method of plasma etching Ga-based compound semiconductors.

The inventors have also developed an ultra low-rate process for controlled etching of extremely shallow features. The flow chart of FIG. 25 shows the steps of the process according to one embodiment. The process includes providing 2510 a process chamber and a source electrode adjacent to the process chamber, where the chamber contains a sample in contact with a platen electrically connected to a first power supply. The source electrode is electrically connected to a second power supply. $SiCl_4$ is flowed 2520 into the chamber, and Ar gas is flowed 2530 into the chamber. $H_2$ gas is also flowed 2540 into the chamber. RF power is supplied 2550 to the platen at a first power level using the first power supply, and RF power is supplied 2560 to the source electrode using the second power supply. A plasma is generated 2570 based on the gases in the process chamber. After generating the plasma, RF power is supplied 2580 to the platen at a second power level lower than the first power level and no greater than about 30 W, and regions of a surface of the sample adjacent to one or more masked portions of the surface are etched 2590 at an etching rate of no more than about 2 nm/min to create a substantially smooth etched surface.

Figure 26:
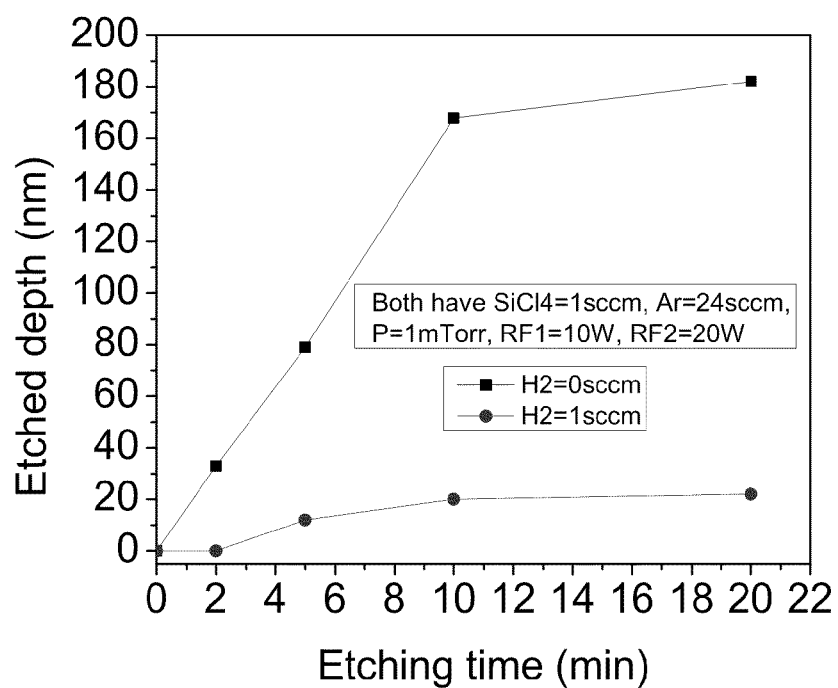
FIG. 26 shows etching depth as a function of etching time for the low rate and ultra-low rate processes.

By adding 1 sccm of $H_2$ flow to the low rate process, the etch rate can be further reduced from about 15-20 nm/min to 1-2 nm/min, as shown in FIG. 26, for the first 10 minutes. There is some saturation in the etching depth for longer etch times. The effect of $H_2$ is believed to be the same as described in the section about the high rate process; namely, $H_2$ slows down the etching process by consuming some of the $SiCl_4$ etching gas through the reaction:

$$SiCl_4 + 2H_2 \rightarrow Si + 4HCl \quad (1)$$

and the Si nanocrystals thereby produced result in even smoother surfaces. With an etching rate of 1-2 nm/min, the depth of the total etch could be controlled to a remarkable accuracy of about 4-8 atomic layers or less. Thus, this ultra low etching rate is beneficial for anisotropic etches requiring extreme precision and minimal etch damage such as: (1) nanomanufacturing of transistors, e.g. the tri-gate transistor for the 32 nm and 22 nm nodes and other types of transistors and other devices for the 16 nm and 11 nm nodes, and beyond; (2) trimming the thickness of a layer to achieve better control of optical or electrical properties of a device, e.g. post growth processing for attaining better uniformity of devices across different growth runs; or (3) controlling the depth of low reflectivity DBR gratings in several devices, e.g. tunable lasers, sensors, or optical logic gates. The desired etch depth is typically about 10 nm or less; thus, an ultra low etch rate of about 2 nanometers per minute or less is desired for timed etches that yield accurate and repeatable results.

As discussed above in the section on high-rate etching, the inventors have found that the composition of the mask has an impact on the etching profile. In particular, the inventors have recognized shortcomings with existing masks made of, for example, $SiO_2$ or a single layer of Cr. With the addition of hydrogen to the process gases, hydrochloric acid (HCl) is produced during etching as described in Equation 1 above. Since HCl attacks some mask materials, the selectivity between the mask and GaAs may be reduced when $H_2$ is present, and the beveled shape of the mask may be transferred to the GaAs mesa. For example, using a $SiO_2$ mask with an Ar flow rate of 0 sccm and $H_2$ flow rate of 2 sccm, the mesa angle is 113 degrees. To overcome this problem and improve the etching profile, the inventors developed masks including at least one metal layer overlying the masked portions of the sample. Advantageously, at least two metal layers overlie the masked portions of the sample. Preferably, the masks are based on layers of nickel and chromium.

The sample preparation may entail patterning a GaAs wafer with photolithography and depositing a 20-nm layer of Ti on the patterned surface to enhance the adhesion between the compound semiconductor and the metals. Next, a 20 nm-layer of Ni and a 100 nm-layer of Cr may be deposited on the Ti layer. The thickness of each of the titanium layer and the nickel layer may lie in the range of from about 10 nm to about 30 nm, and the chromium layer is preferably from about 80 nm to about 120 nm thick. After liftoff, the remaining Ni/Cr forms the etching mask.

FIGS. 14A-14C, referred to previously, show SEM images of a mesa formed at different chamber pressures (1, 3 and 5 mTorr, respectively) using a $SiO_2$ etching mask, and FIGS. 15A-15C show SEM images of a mesa formed at different chamber pressures (1, 3, and 5 mTorr, respectively) using the improved Ni/Cr etching mask. As can be seen, the verticality of the mesa structures is substantially increased with the Ni/Cr mask.

In summary, the inventors have found that it is possible to significantly improve the quality of etched surfaces of Ga-based compound semiconductors at both high and low etching rates by properly tailoring the etch chemistry, including the types of process gases employed and their flow rates into the chamber, and by controlling other process parameters, such as the etching mask employed. The etching methods permit desired etch rates to be attained while the smoothness of the etched surface and the verticality of the etched profiles are optimized. The high rate and low rate etching methods described herein may be applied to any Ga-based compound semiconductor, including, but not limited to, GaAs, AlGaAs, InGaAs, GaAsP, InGaP, InGaN, AlGaN, GaInAs, and AlGaInAs, and may be more broadly applicable to other semiconductors as well.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

The invention claimed is:

1. A method of plasma etching Ga-based compound semiconductors, the method comprising:
   providing a process chamber and a source electrode adjacent to the process chamber, the process chamber containing a sample comprising a Ga-based compound semiconductor, the sample being in contact with a platen electrically connected to a first power supply, and the source electrode being electrically connected to a second power supply;
   flowing $SiCl_4$ gas into the chamber;
   flowing Ar gas into the chamber;
   flowing $H_2$ gas into the chamber;
   supplying RF power to the source electrode using the second power supply;
   supplying RF power to the platen using the first power supply;
   generating a plasma based on the combined three gases in the process chamber; and
   etching regions of a surface of the sample adjacent to one or more masked portions of the surface to create a substantially smooth etched surface including features having substantially vertical walls beneath the masked portions.

2. The method of claim 1 wherein the $SiCl_4$ gas has a flow rate into the chamber of from about 2 sccm to about 8 sccm.

3. The method of claim 1 wherein the Ar gas has a flow rate into the chamber of from about 1 sccm to about 8 sccm.

4. The method of claim 3 wherein the flow rate of the Ar gas is from about 3 sccm to about 5 sccm.

5. The method of claim 1 wherein the $H_2$ gas has a flow rate into the chamber of from about 0.5 sccm to about 3 sccm.

6. The method of claim 1 wherein the source electrode is powered at a power level of from about 100 W to about 600 W.

7. The method of claim 6 wherein the power level is from about 400 W to about 600 W.

8. The method of claim 1 wherein the platen is powered at a power level of from about 60 W to about 150 W.

9. The method of claim 8 wherein the power level is from about 90 W to about 150 W.

10. The method of claim 1 further comprising maintaining a chamber pressure of from about 1 mTorr to about 8 mTorr.

11. The method of claim 10 wherein the chamber pressure is from about 1 mTorr to about 5 mTorr.

12. The method of claim 1 wherein at least one metal layer overlies the masked portions.

13. The method of claim 12 wherein at least two metal layers overlie the masked portions.

14. The method of claim 13, wherein a lower metal layer comprises nickel and an upper metal layer comprises chromium.

15. The method of claim 14 further comprising a titanium layer between the lower metal layer and the surface of the sample.

16. The method of claim 1 wherein the etching is carried out at an etch rate of at least about 450 nm/min.

17. The method of claim 1 wherein the substantially smooth etched surface of the sample has an rms roughness of about 0.2 nm or less.

18. The method of claim 17, wherein the rms roughness is about 0.1 nm or less.

19. The method of claim 1 wherein the substantially vertical walls measure about 90° +/−2° with respect to the etched surface of the sample.

20. The method of claim 1 further comprising maintaining a chamber pressure of from about 1 mTorr to about 5 mTorr,
   wherein the $SiCl_4$ gas has a flow rate into the chamber of from about 1 sccm to about 5 sccm, the Ar gas has a flow rate into the chamber of from about 3 sccm to about 5 sccm, and the $H_2$ gas has a flow rate into the chamber of from about about 0.5 sccm to about 2 sccm,
   wherein the source electrode is powered at a power level of from about 400 W to about 600 W and the platen is powered at a power level of from about 90 W to about 150 W,
   wherein two metal layers overlie the masked portions, a lower metal layer of the two metal layers comprising nickel and an upper metal layer of the two metal layers comprising chromium; and further comprising a titanium layer between the lower metal layer and the surface of the sample,
   wherein the etching is carried out at an etch rate of at least about 450 nm/min,
   wherein the substantially smooth etched surface of the sample has an rms roughness of about 0.2 nm or less, and
   wherein the substantially vertical walls measure about 90° +/−2° with respect to the etched surface of the sample.

* * * * *

UNITED STATES PATENT AND TRADEMARK OFFICE
CERTIFICATE OF CORRECTION

PATENT NO. : 8,338,308 B2  
APPLICATION NO. : 12/638741  
DATED : December 25, 2012  
INVENTOR(S) : Weibin Qiu et al.

Page 1 of 1

It is certified that error appears in the above-identified patent and that said Letters Patent is hereby corrected as shown below:

On the Title Page

Item (74), before "Hofer Gilson" replace "Drinks" with --Brinks--.

Signed and Sealed this
Seventeenth Day of June, 2014

Michelle K. Lee
*Deputy Director of the United States Patent and Trademark Office*